(12) United States Patent
Takimoto

(10) Patent No.: US 11,004,974 B1
(45) Date of Patent: May 11, 2021

(54) FIELD EFFECT TRANSISTORS CONTAINING ELECTRIC FIELD ASSIST LAYERS AT GATE CORNERS AND METHOD OF MAKING THE SAME

(71) Applicant: SANDISK TECHNOLOGIES LLC, Addison, TX (US)

(72) Inventor: Takuma Takimoto, Kamakura (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/791,049

(22) Filed: Feb. 14, 2020

(51) Int. Cl.
*H01L 29/78* (2006.01)
*H01L 29/06* (2006.01)
*H01L 29/66* (2006.01)

(52) U.S. Cl.
CPC ...... *H01L 29/7836* (2013.01); *H01L 29/0649* (2013.01); *H01L 29/6659* (2013.01)

(58) Field of Classification Search
CPC ............. H01L 29/7836; H01L 29/0649; H01L 29/6659
See application file for complete search history.

(56) References Cited

U.S. PATENT DOCUMENTS

| | | | |
|---|---|---|---|
| 9,859,422 B2 | 1/2018 | Nishikawa et al. |
| 10,115,735 B2 | 10/2018 | Amano et al. |
| 10,256,099 B1 | 4/2019 | Akaiwa et al. |
| 10,256,167 B1 | 4/2019 | Fukuo et al. |
| 10,355,017 B1 | 7/2019 | Nakatsuji et al. |
| 10,355,100 B1 | 7/2019 | Ueda et al. |
| 2010/0156559 A1 | 6/2010 | Wang et al. |
| 2013/0221441 A1 | 8/2013 | Jagannathan et al. |
| 2016/0351709 A1 | 12/2016 | Nishikawa et al. |
| 2018/0247954 A1 | 8/2018 | Amano et al. |
| 2018/0331118 A1 | 11/2018 | Amano |
| 2019/0296012 A1 | 9/2019 | Iwata et al. |

OTHER PUBLICATIONS

Notification of Transmittal of the International Search Report and Written Opinion of the International Search Authority for International Patent Application No. PCT/US2020/037199, dated Oct. 29, 2020, 9 pages.
U.S. Appl. No. 16/130,104, filed Sep. 13, 2018, SanDisk Technologies LLC.
U.S. Appl. No. 16/249,300, filed Jan. 16, 2019, SanDisk Technologies LLC.

*Primary Examiner* — Laura M Menz
*Assistant Examiner* — Vicki B. Booker
(74) *Attorney, Agent, or Firm* — The Marbury Law Group PLLC

(57) ABSTRACT

A semiconductor structure includes a source region, a drain region, a channel region located between the source region and the drain region, a gate stack structure including a gate dielectric and a gate electrode that overlies the gate dielectric, such that a first gap region is present between an area of the source region and an area of the gate electrode in a plan view and a second gap region is present between an area of the drain region and the area of the gate electrode in the plan view, a contact-level dielectric layer overlying the source region and the drain region and laterally surrounding the gate stack structure, and at least one assist-field metallic plate located vertically above a top surface of the gate electrode and having an areal overlap with at least one of the first gap region and the second gap region in the plan view.

20 Claims, 19 Drawing Sheets

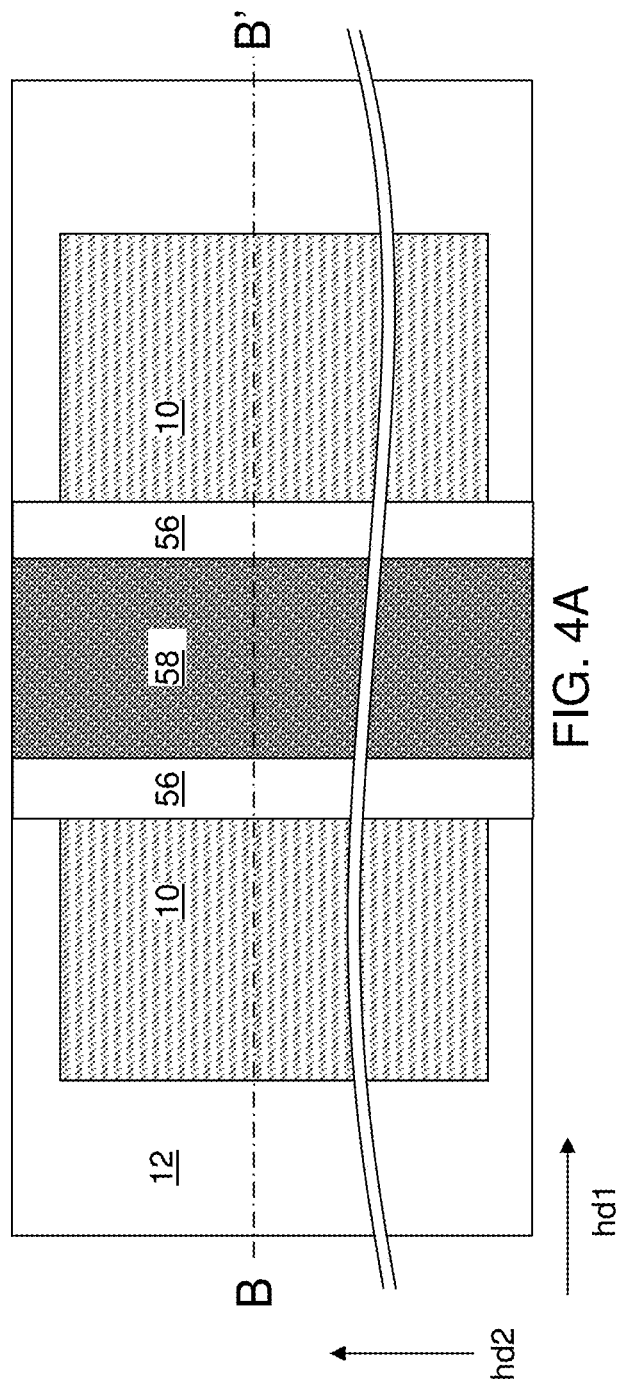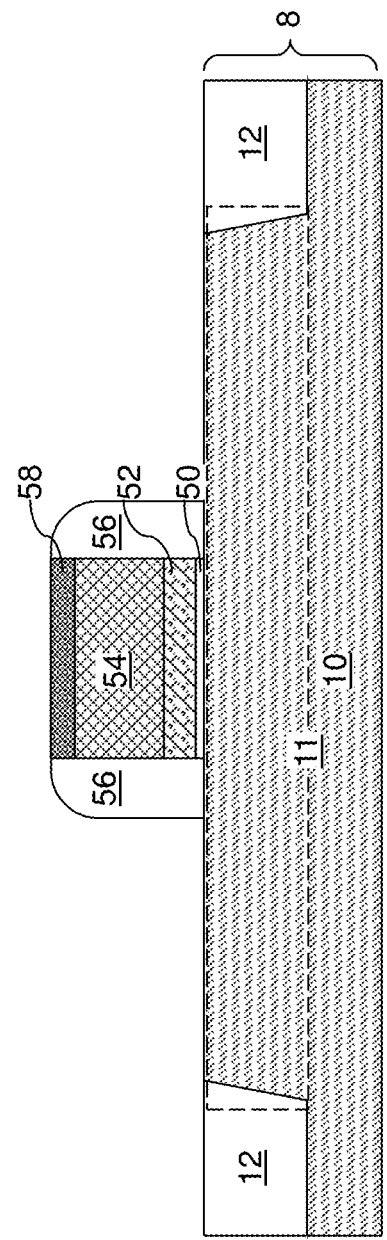

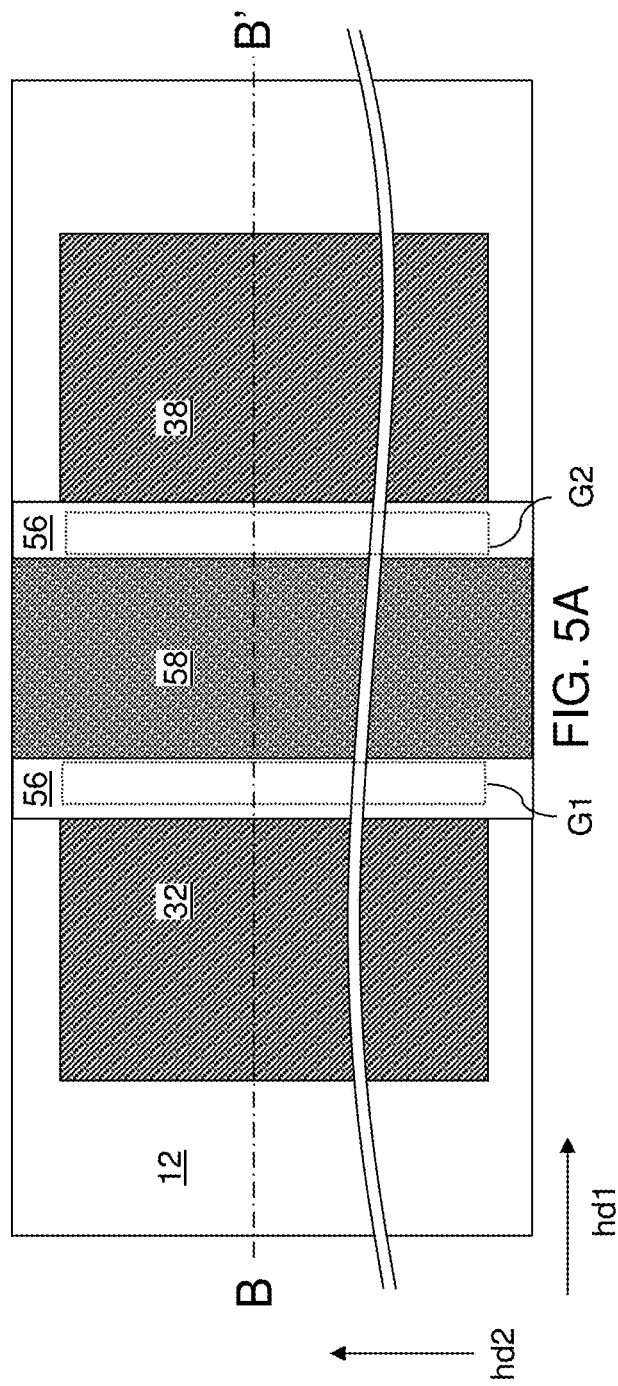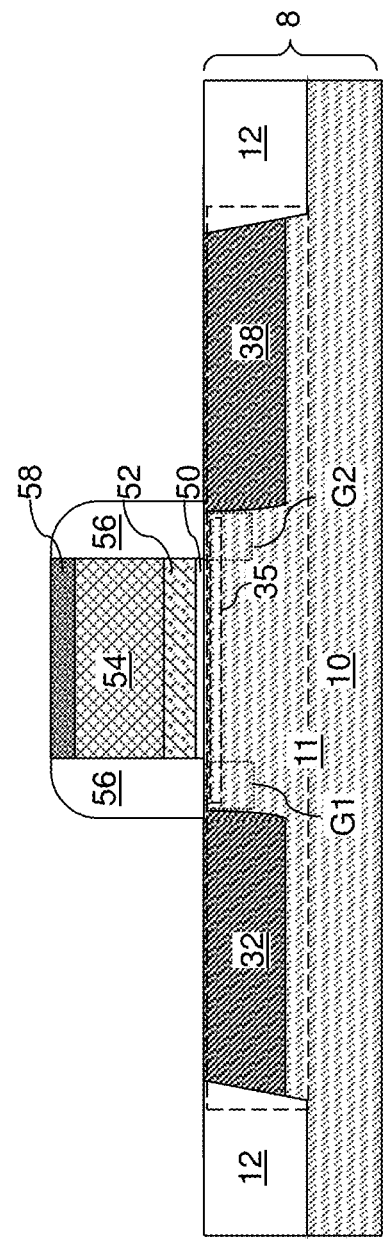

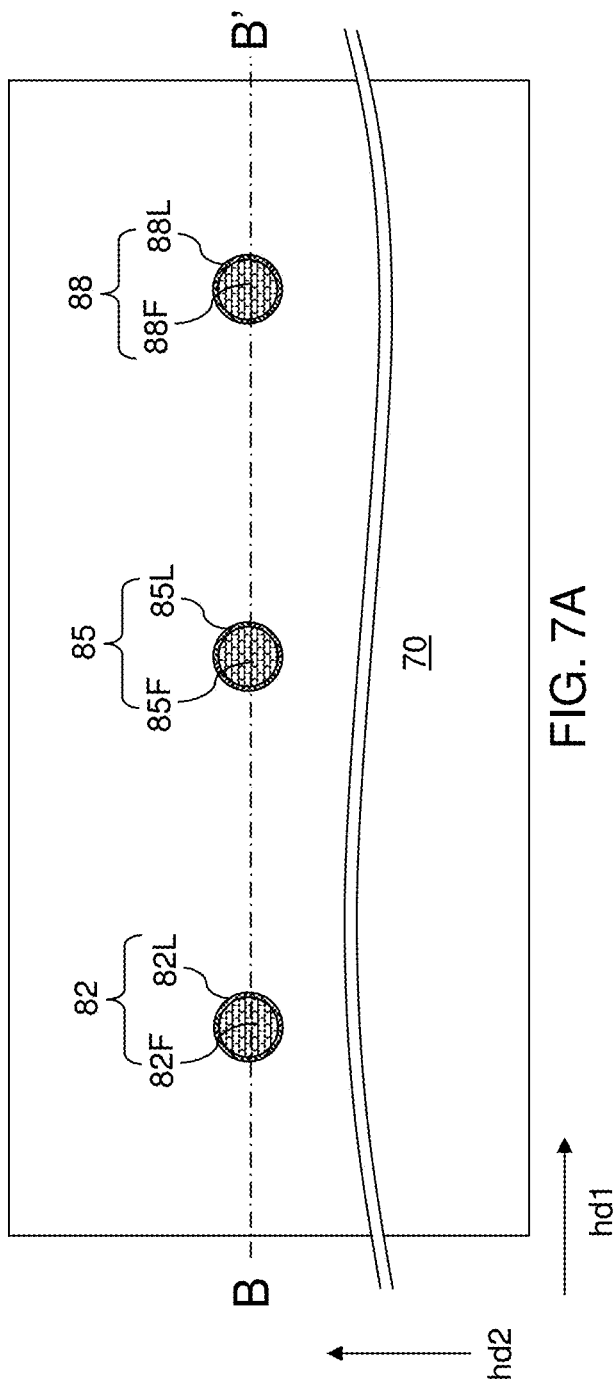
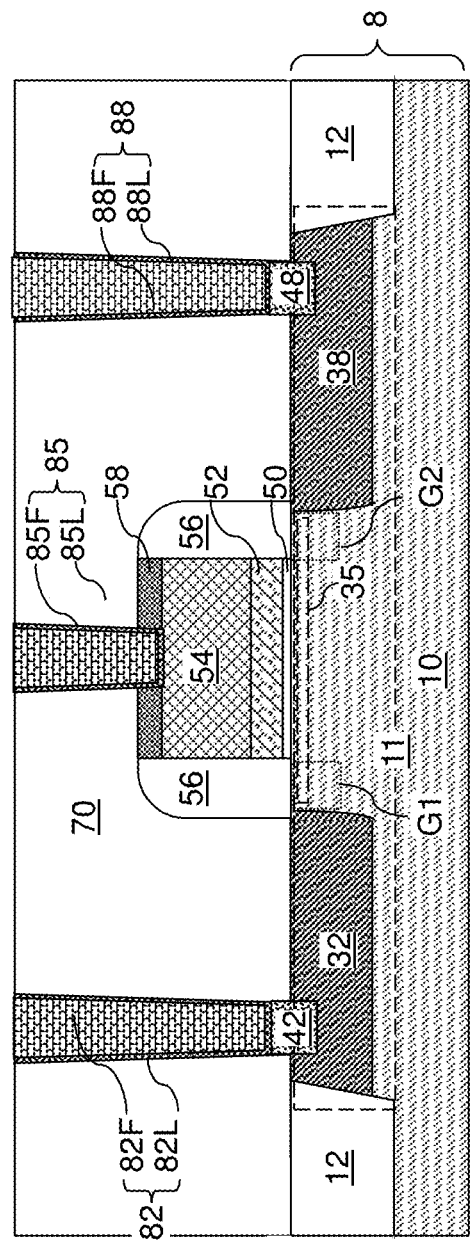
FIG. 7A
FIG. 7B

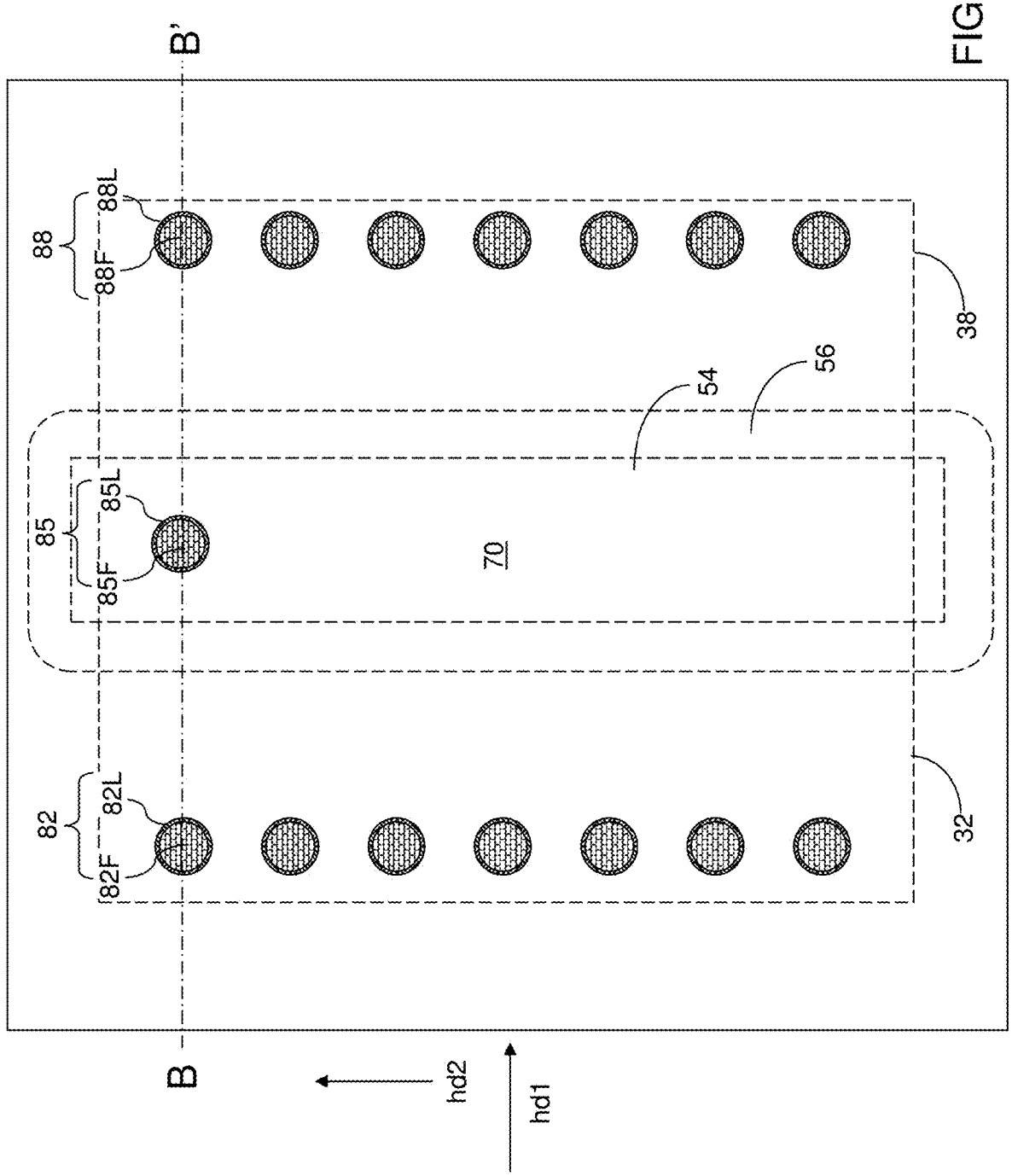

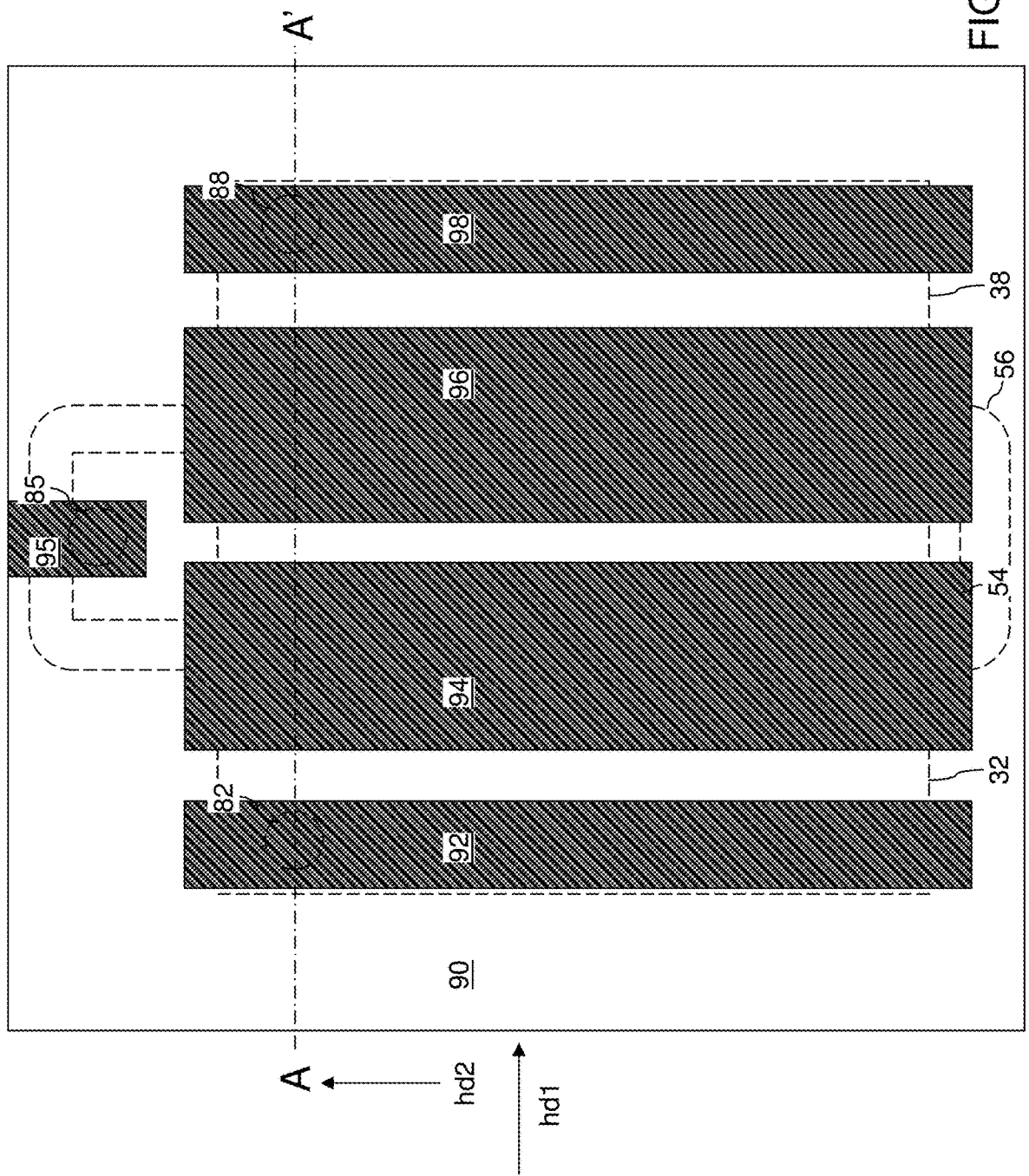

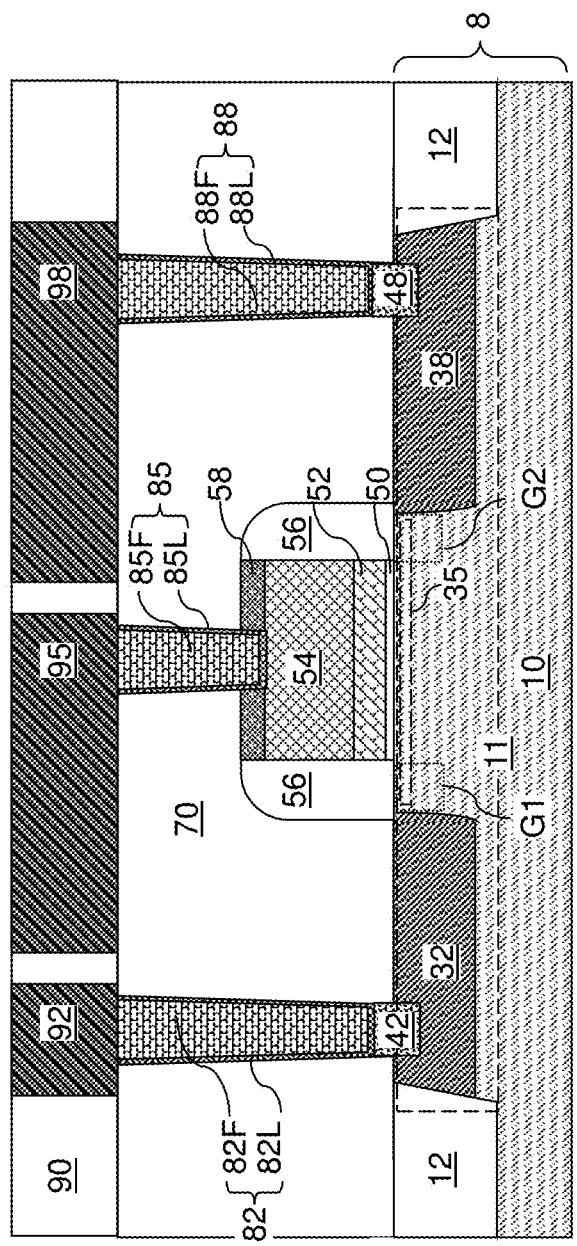

FIELD EFFECT TRANSISTORS CONTAINING ELECTRIC FIELD ASSIST LAYERS AT GATE CORNERS AND METHOD OF MAKING THE SAME

FIELD

The present disclosure relates generally to the field of semiconductor devices, and particularly to field effect transistors containing electric field assist layers at gate corners and methods of manufacturing the same.

BACKGROUND

The electric field that a gate electrode of a field effect transistor generates is significantly weaker over the end portions of a channel region that underlie gate sidewall spacers than over the middle portion of the channel region. High dopant concentration can be employed for source regions and drain regions in order to reduce electrical resistance and to reduce degradation of the on-current. However, low resistance of the source region and the drain region increases the electric field around the gate edges while the transistor is in an off state. Strong electric field at the gate edges can decrease the breakdown voltage and degrade the reliability of the field effect transistor.

Lightly doped extension regions (i.e., lightly-doped drain (LDD) regions) can reduce the channel region resistance under the gate sidewall spacers. However, formation of the lightly doped extension regions requires an additional ion implantation step, which increases production cost. Further, dopant profile within the lightly doped extension regions needs to be optimized in order to prevent adverse impact on the reliability of field effect transistors.

SUMMARY

According to an aspect of the present disclosure, a semiconductor structure includes a source region, a drain region, a channel region located between the source region and the drain region, a gate stack structure including a gate dielectric and a gate electrode that overlies the gate dielectric, such that a first gap region is present between an area of the source region and an area of the gate electrode in a plan view and a second gap region is present between an area of the drain region and the area of the gate electrode in the plan view, a contact-level dielectric layer overlying the source region and the drain region and laterally surrounding the gate stack structure, and at least one assist-field metallic plate located vertically above a top surface of the gate electrode and having an areal overlap with at least one of the first gap region and the second gap region in the plan view.

According to another aspect of the present disclosure, a method of forming a semiconductor structure is provided, which comprises: forming a shallow trench isolation structure that laterally surrounds a transistor body region having a doping of a first conductivity type in a semiconductor substrate; forming a gate stack structure including a gate dielectric and a gate electrode over the transistor body region; forming a source region and a drain region having a doping of a second conductivity type that is an opposite of the first conductivity type in portions of the transistor body region that are laterally spaced from the gate stack structure, wherein a first gap region is present between an area of the source region and an area of the gate electrode in a plan view and a second gap region is present between an area of the drain region and the area of the gate electrode in the plan view, and a channel region laterally extends between the source region and the drain region; forming a contact-level dielectric layer over the source region and the drain region and around the gate stack structure; and forming at least one assist-field metallic plate directly on a top surface of the contact-level dielectric layer, wherein the at least one assist-field metallic plate has an areal overlap with at least one of the first gap region and the second gap region in the plan view.

BRIEF DESCRIPTION OF THE DRAWINGS

FIG. 4A is a top-down view of a first exemplary structure after formation of a gate spacer according to an embodiment of the present disclosure.

FIG. 4B is a vertical cross-sectional view along the vertical plane B-B' of FIG. 4A.

FIG. 5A is a top-down view of a first exemplary structure after formation of a source region and a drain region according to an embodiment of the present disclosure.

FIG. 5B is a vertical cross-sectional view along the vertical plane B-B' of FIG. 5A.

FIG. 7A is a top-down view of a first exemplary structure after formation of metal-semiconductor alloy portions and contact via structures according to an embodiment of the present disclosure.

FIG. 7B is a vertical cross-sectional view along the vertical plane B-B' of FIG. 7A.

FIG. 7C is a top-down view of an alternative configuration of the first exemplary structure at the processing steps of FIGS. 7A and 7B.

FIG. 9B is a vertical cross-sectional view along the vertical plane B-B' of FIG. 9A.

FIG. 12A is a vertical cross-sectional view of a fourth exemplary structure after formation of metallic plates according to an embodiment of the present disclosure.

DETAILED DESCRIPTION

Figure 1A:
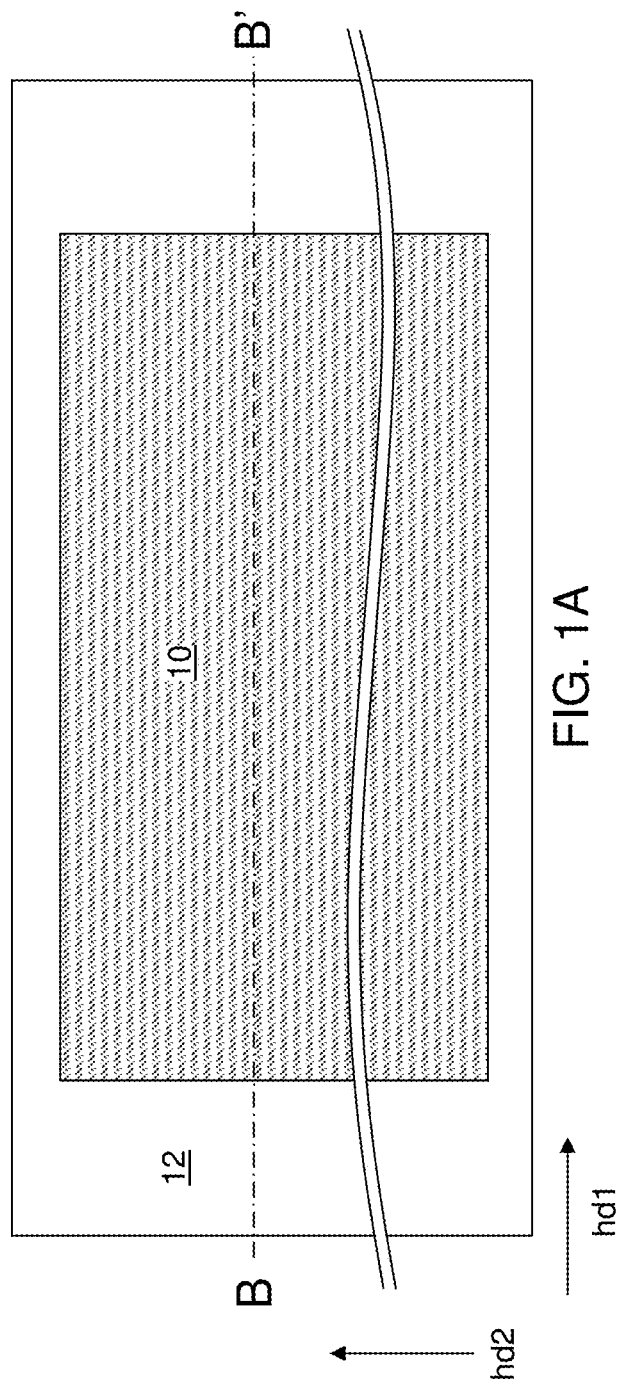
FIG. 1A is a top-down view of a first exemplary structure after formation of a shallow trench isolation structure according to an embodiment of the present disclosure.

As discussed above, embodiments of the present disclosure are directed to field effect transistors containing electric field assist layers overlying the gate corners (e.g., overlying the gate sidewall spacers) and methods of manufacturing the same, the various aspects of which are discussed in detail herebelow. The additional LDD implantation step may be omitted if desired to decrease the production cost. The field effect transistor of the embodiments of the present disclosure can provide a high on-current and a low off-current with high reliability and lower production cost.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, thereabove, and/or therebelow.

Figure 1B:
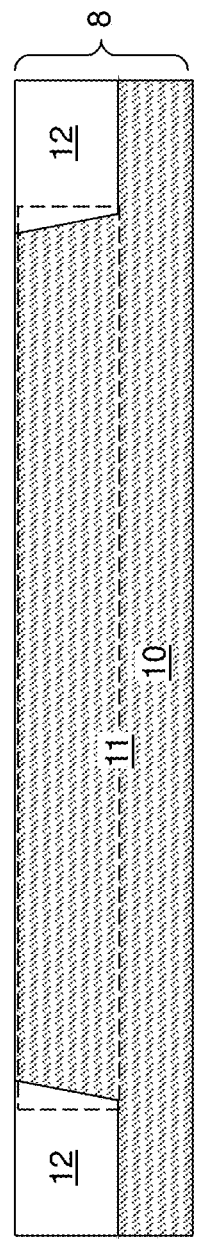
FIG. 1B is a vertical cross-sectional view along the vertical plane B-B' of FIG. 1A.

Referring to FIGS. 1A and 1B, a first exemplary structure according to an embodiment of the present disclosure is illustrated, which can be used, for example, to fabricate a field effect transistor, such as a MOSFET. The MOSFET may be a PMOS or an NMOS and may be located in a complementary metal oxide semiconductor (CMOS) device containing both PMOS and NMOS transistors. A semiconductor substrate 8 contains a semiconductor material layer 10 at least in an upper region thereof. The semiconductor substrate 8 can be a bulk semiconductor substrate, such as a single crystal silicon wafer. The semiconductor material layer 10 may comprise an upper region of the semiconductor substrate 8, a doped well in the upper region of the semiconductor substrate 8 or an epitaxial semiconductor layer grown over the semiconductor substrate 8. Alternatively, the semiconductor substrate 8 can be a semiconductor-on-insulator (SOI) substrate in which the semiconductor material layer 10 is a top semiconductor layer overlying a buried insulator layer in the substrate 8.

The semiconductor material layer 10 can include a single crystalline semiconductor material, such as single crystalline silicon. The atomic concentration of first conductivity type dopants in the semiconductor material layer 10 can be in a range from $1.0 \times 10^{14}/cm^3$ to $1.0 \times 10^{17}/cm^3$, although lesser and greater atomic concentrations can also be used.

In one embodiment, the semiconductor material layer 10 comprises one or more doped wells in the upper portion of the semiconductor substrate 8. A first subset of the doped wells may be p-doped wells, and a second subset of the doped wells may be n-doped wells. For the purpose of description of embodiments of the present disclosure, the illustrated portion of the semiconductor material layer (e.g., doped well) 10 is presumed to have a doping of a first conductivity type, which may be p-type or n-type. A second-conductivity-type field effect transistor including a source region and a drain region having of a doping of a second conductivity type can be subsequently formed on the illustrated portion of the semiconductor material layer 10 having a doping of the first conductivity type. The second conductivity type is the opposite of the first conductivity type. For example, if the first conductivity type is p-type, then the second conductivity type is n-type, and vice versa. Doped wells having a doping of the opposite conductivity type can be formed in another (unillustrated) portion of the semiconductor substrate 8. Generally, p-type field effect transistors including a p-doped source region, a p-doped drain region, and an n-doped channel region can be formed on a portion of the semiconductor material layer 10 having an n-type doping, and n-doped field effect transistors including an n-doped source region, an n-doped drain region, and a p-doped channel region can be formed on a portion of the semiconductor material layer 10 having a p-type doping.

Shallow trench isolation structures 12 can be formed in upper portions of the semiconductor material layer 10 to provide electrical isolation between neighboring devices. For example, shallow trenches can be formed around each device region that requires electrical isolation from neighboring device regions, and can be filled with a dielectric material such as silicon oxide. Excess portions of the dielectric material can be removed from above the top surface of the semiconductor material layer 10 by a planarization process such as chemical mechanical planarization. Remaining portions of the dielectric material in the shallow trenches constitute the shallow trench isolation structures 12.

Each portion of the semiconductor material layer 10 that is laterally surrounded by a shallow trench isolation structure 12 can be used to form a semiconductor device therein and/or thereupon. The illustrated portion of the semiconductor material layer 10 in FIGS. 1A and 1B includes a region that can be subsequently used as a body region of a field effect transistor. This region is herein referred to as a transistor body region 11. The shallow trench isolation structure 12 laterally surrounds the transistor body region 11. The illustrated portion of the semiconductor material layer 10, including the transistor body region 11, can have a doping of the first conductivity type. In one embodiment, the transistor body region 11 can have a rectangular horizontal cross-sectional shape in plan view.

The depth of the shallow trench isolation structure 12 may be in a range from 100 nm to 500 nm, although lesser and greater depths can also be employed. The area of the transistor body region 11 can depend on the size of the field effect transistor to be formed. The dimension of the transistor body region 11 along the channel direction (i.e., the current flow direction between source and drain regions in a field effect transistor to be subsequently formed), such as the first horizontal direction hd1, can be in a range from 50 nm to 5,000 nm. The dimension of the transistor body region 11 along the gate direction (i.e., the gate stack structure in the field effect transistor to be subsequently formed), such as the second horizontal direction hd2 can be in a range from 30 nm to 5,000 nm, and is herein referred to as a channel width.

Figure 2A:
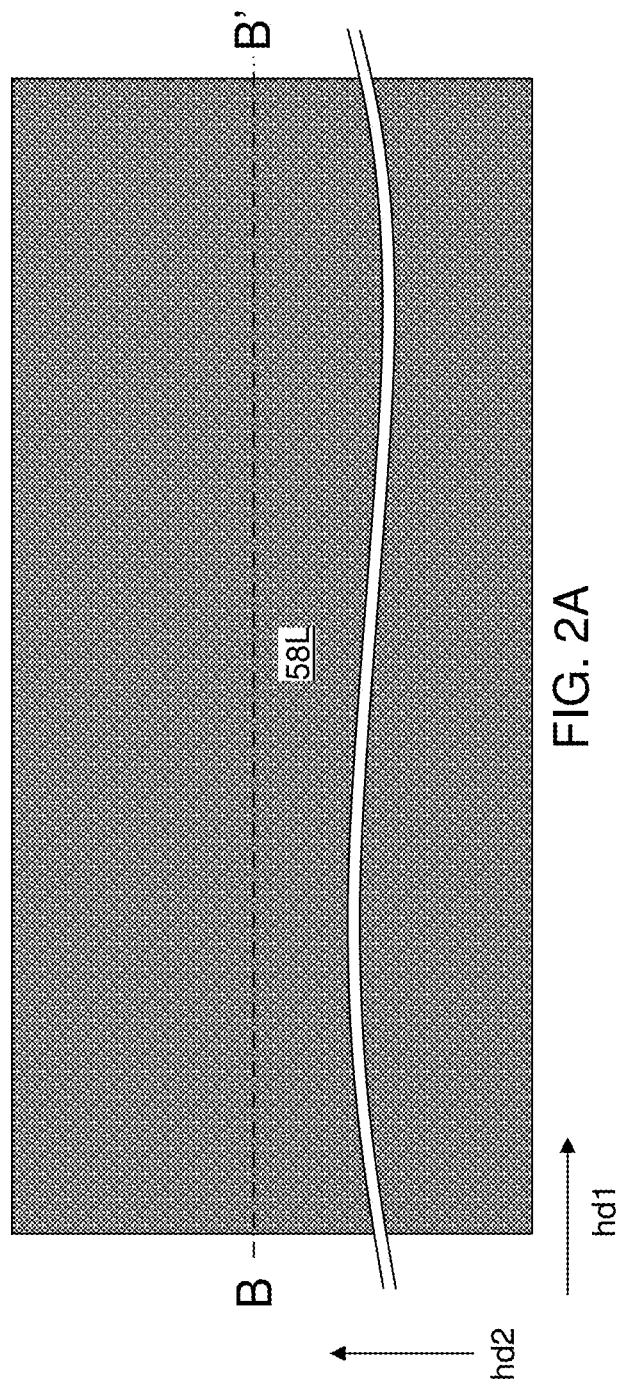
FIG. 2A is a top-down view of a first exemplary structure after formation of gate stack material layers according to an embodiment of the present disclosure.
Figure 2B:
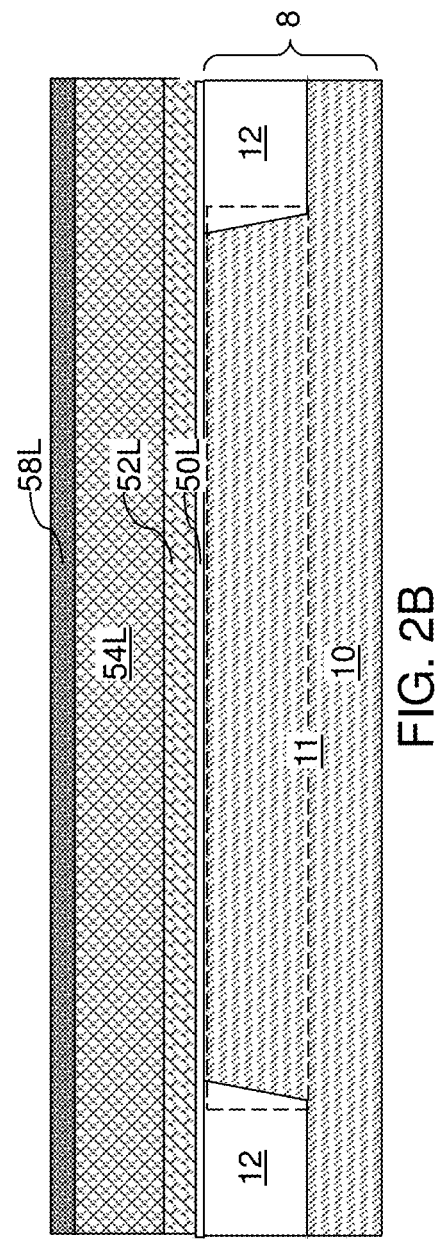
FIG. 2B is a vertical cross-sectional view along the vertical plane B-B' of FIG. 2A.

Referring to FIGS. 2A and 2B, a gate dielectric layer 50L, at least one gate material layer (52L, 54L), and an optional gate cap dielectric layer 58L are sequentially deposited on the top surface of the semiconductor material layer 10. The gate dielectric layer 50L includes a gate dielectric material, such as silicon oxide and/or a dielectric metal oxide. The thickness of the gate dielectric layer 50L can be in a range from 1 nm to 20 nm, although a greater thickness can also be employed.

The at least one gate material layer (52L, 54L) can include, for example, a semiconductor gate material layer 52L including a doped semiconductor material and/or a metallic gate material layer 54L including a metallic material. The semiconductor gate material layer 52L (if present) may be doped in-situ (i.e., during deposition) or ex-situ (i.e., after deposition by an ion implantation process). The metallic gate material layer 54L includes a metal and/or a metallic alloy such as tungsten, titanium, tantalum, titanium nitride, tungsten silicide, titanium silicide, etc. The thickness of the at least one gate material layer (52L, 54L) may be in a range from 50 nm to 300 nm, although lesser and greater thicknesses can also be employed.

The gate cap dielectric layer 58L includes a dielectric material that can subsequently function as an etch stop structure or a planarization stopping layer. In one embodiment, the gate cap dielectric layer 58L can include silicon nitride. The thickness of the gate cap dielectric layer 58L can be in a range from 5 nm to 50 nm, such as from 10 nm to 30 nm, although lesser and greater thicknesses can also be employed.

Figure 3A:
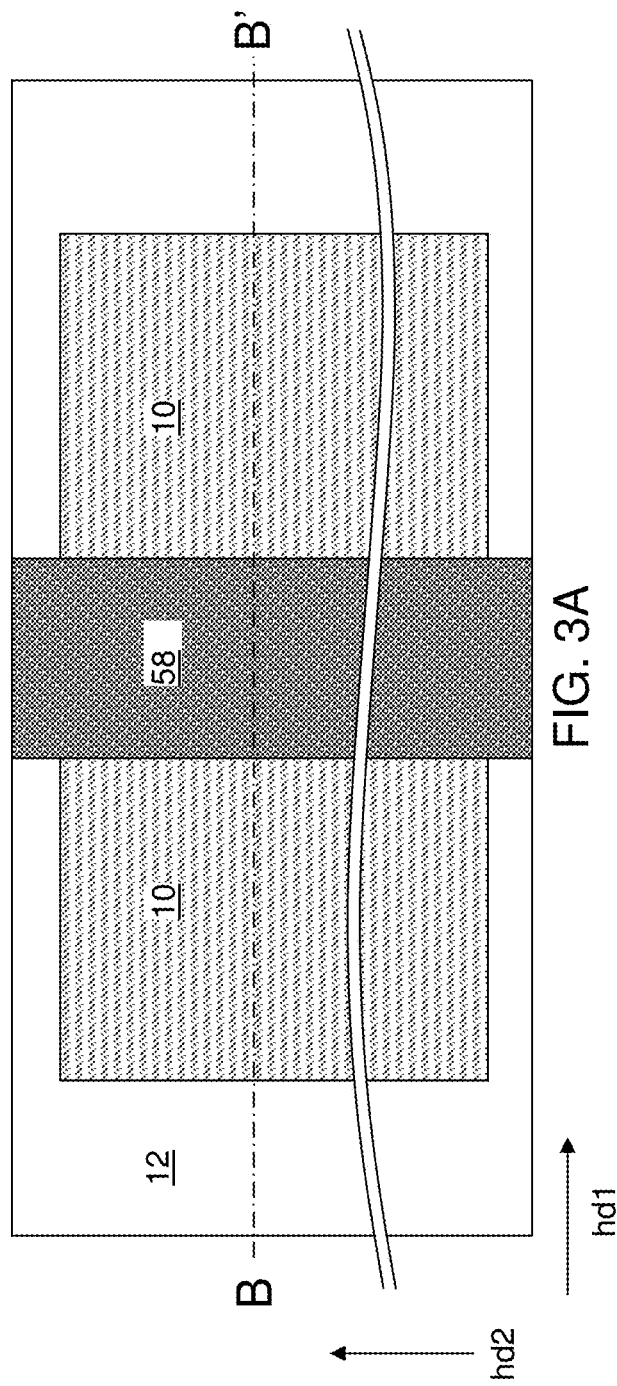
FIG. 3A is a top-down view of a first exemplary structure after formation of a gate stack structure according to an embodiment of the present disclosure.
Figure 3B:
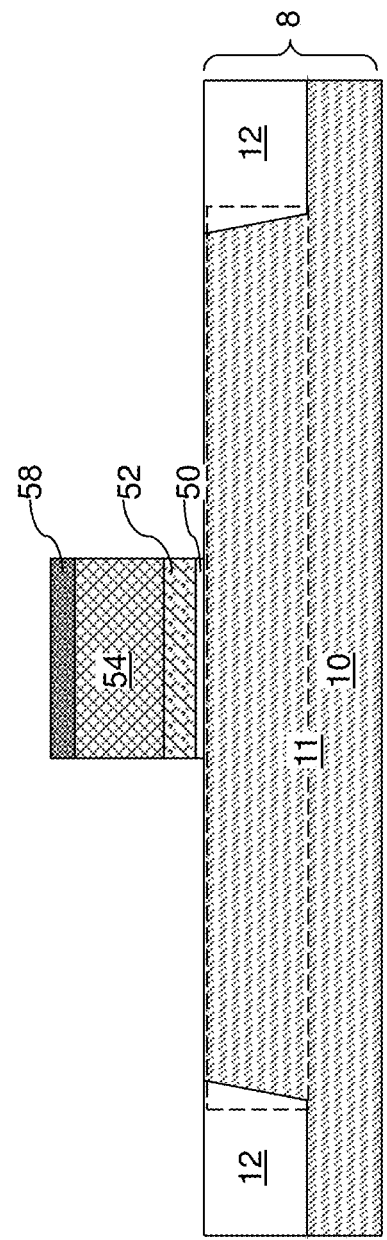
FIG. 3B is a vertical cross-sectional view along the vertical plane B-B' of FIG. 3A.

Referring to FIGS. 3A and 3B, the gate dielectric layer 50L, the at least one gate material layer (52L, 54L), and the gate cap dielectric layer 58L can be patterned, for example, by application and patterning of a photoresist layer thereabove, and by transferring the pattern in the photoresist layer through the gate cap dielectric layer 58L, the at least one gate material layer (52L, 54L), and optionally through the gate dielectric layer 50L employing an anisotropic etch process. A step of the anisotropic etch process that etches the at least one gate material layer (52L, 54L) can stop on the top surface of the gate dielectric layer 50L. Subsequently, the gate dielectric layer 50L may optionally be patterned employing the semiconductor material layer 10 as an etch stop layer.

Patterned portion of the gate cap dielectric layer 58L constitutes a gate cap dielectric 58, patterned portion of the at least one gate material layer (52L, 54L) constitutes a gate electrode (52, 54), and patterned portion of the gate dielectric layer 50L constitutes a gate dielectric 50. Each stack of a gate dielectric 50, a gate electrode (52, 54), and a gate cap dielectric 58 constitutes a gate stack structure (50, 52, 54, 58). A gate stack structure (50, 52, 54, 58) extends over the transistor body region 11 in the second horizontal direction hd2, as illustrated in FIGS. 3A and 3B. The gate electrode (52, 54) includes at least one of a semiconductor gate electrode portion 52 and a metallic gate electrode portion 54. The semiconductor gate electrode portion 52 is a patterned portion of the semiconductor gate material layer 52L, and the metallic gate electrode portion 54 is a patterned portion of the metallic gate electrode layer 54L. In the illustrated portion of the first exemplary structure, the sidewalls of the gate stack structure (50, 52, 54, 58) overlying the transistor body region 11 can be perpendicular to the first horizontal direction hd1, and the gate stack structure (50, 52, 54, 58) can have a uniform dimension along the first horizontal direction hd1, which is herein referred to as a gate length. The gate length can be, for example, in a range from 10 nm to 1,000 nm.

Referring to FIGS. 4A and 4B, at least one dielectric material such as silicon oxide and/or silicon nitride can be conformally deposited over the gate stack structure (50, 52, 54, 58) and the semiconductor material layer 10. The at least one dielectric material can be subsequently anisotropically etched using a sidewall spacer etch process to remove horizontally-extending portions. Each remaining vertically-extending portion of the at least one dielectric material constitutes a gate spacer (i.e., sidewall spacer) 56 that contacts, and laterally surrounds, at least the gate electrode (52, 54) (e.g., contacts the gate stack structure (50, 52, 54, 58)). The gate spacer 56 can have a lateral width, which can be in a range from 10 nm to 200 nm, such as from 20 nm to 100 nm.

Referring to FIGS. 5A and 5B, dopants of the second conductivity type can be implanted into portions of the transistor body region 11 that are not masked by the gate stack structure (50, 52, 54, 58) and the gate spacers 56. The dose of the dopants of the second conductivity type can be selected so that implanted portions of the transistor body region 11 are converted into doped semiconductor material portions having a net doping of the second conductivity type. The implanted doped semiconductor material portions include a source region 32 and a drain region 38. A first p-n junction is formed between the source region 32 and the remaining portion of the transistor body region 11, and a second p-n junction is formed between the drain region 38 and the remaining portion of the transistor body region 11. The atomic concentration of dopants of the second conductivity in the source region 32 and the drain region 38 can be in a range from $1 \times 10/cm^3$ to $2 \times 10/cm^3$, although lesser and greater dopant concentrations can also be used.

Generally, a source region 32 and a drain region 38 having a doping of the second conductivity type can be formed in portions of the transistor body region 11 that are laterally spaced from the gate stack structure (50, 52, 54, 58). A first gap region G1 is present under a source side gate spacer 56 between an area of the source region 32 and an area of the gate electrode (52, 54) in a plan view, and a second gap region G2 is present under a drain side gate spacer 56 between an area of the drain region 38 and the area of the gate electrode (52, 54) in the plan view. The first gap region G1 is a surface portion of the transistor body region 11 that does not have an areal overlap with the area of the gate electrode (52, 54), and is located between the area of the source region 32 and the portion of the transistor body region 11 that has an areal overlap with the gate electrode (52, 54). The second gap region G2 is a surface portion of the transistor body region 11 that does not have an areal overlap with the area of the gate electrode (52, 54), and is located between the area of the drain region 38 and the portion of the transistor body region 11 that has an areal overlap with the gate electrode (52, 54). The plan view is a view along the direction which is perpendicular to the top surface of the transistor body region 11 and in which all elements are shown irrespective of whether any element is blocked by an overlying element or an underlying element along the direction of the view.

A channel region 35 laterally extends between the source region 32 and the drain region 38. The area of the channel region 35 include the entire area of the overlap between the gate electrode (52, 54) and the transistor body region 11, the entire area of the first gap region G1, and the entire area of the second gap region G2. Gate spacers 56 may have an areal overlap with the entirety of the first gap region G1 and the second gap region G2 in the plan view.

Each of the first gap region G1 and the second gap region G2 can have a respective rectangular shape in the plan view. The gap regions (G1, G2) can be laterally spaced apart along the first horizontal direction hd1 by a separation distance that is the same as the gate length, i.e., the dimension of the gate stack structure (50, 52, 54, 58) along the first horizontal direction. The first gap region G1 and the second gap region G2 can have the same width along the first horizontal direction hd1, which can be in a range from 30% to 99% of the width of the gate spacer 56 along direction hd1. The width of the first gap region G1 and the second gap region G2 along the first horizontal direction hd1 is determined by the lateral shift of the p-n junctions between the transistor body region 11 and each of the source region 32 and the drain region 38 relative to the outer sidewalls of the gate spacer 56, which is determined by stochastic lateral movement of implanted dopants of the second conductivity during the ion implantation process that forms the source region 32 and the drain region 38.

In one embodiment, the entirety of the transistor body region 11 can have a doping of the first conductivity type. The entirety of the source region 32 and the entirety of the drain region 38 has a doping of a second conductivity type that is an opposite of the first conductivity type. The first p-n junction between the transistor body region 11 and the source region 32 does not contact, and is laterally spaced from, the gate stack structure (50, 52, 54, 58). The second p-n junction between the transistor body region 11 and the drain region 38 does not contact, and is laterally spaced from, the gate stack structure (50, 52, 54, 58).

Figure 6A:
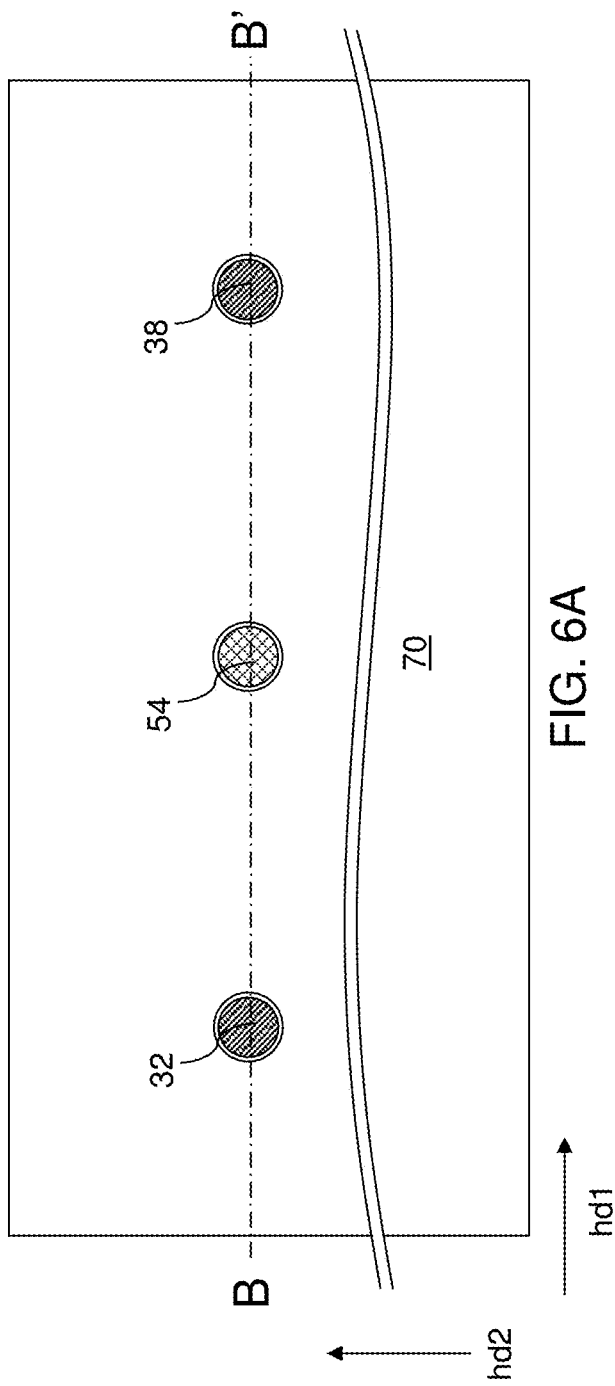
FIG. 6A is a top-down view of a first exemplary structure after formation of a contact-level dielectric layer and contact via cavities according to an embodiment of the present disclosure.
Figure 6B:
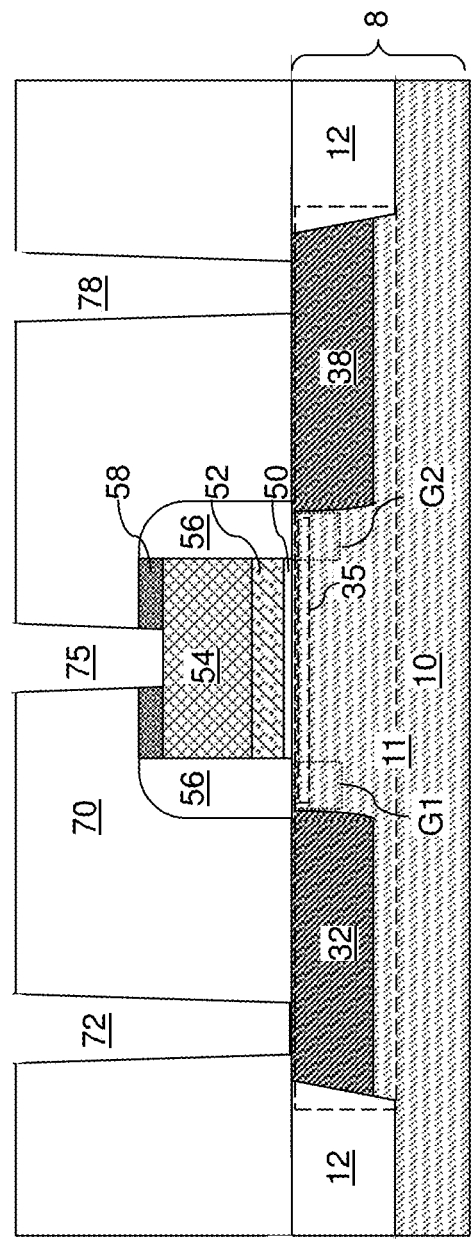
FIG. 6B is a vertical cross-sectional view along the vertical plane B-B' of FIG. 6A.

Referring to FIGS. 6A and 6B, a dielectric material can be deposited over the gate stack structure (50, 52, 54, 58), the gate spacer 56, and the semiconductor substrate 8 to form a contact-level dielectric layer 70. The contact-level dielectric layer 70 may include a self-planarizing dielectric material (such as flowable oxide (FOX)) or a planarizable dielectric material such as silicon oxide. Silicon oxide can be planarized by a chemical mechanical planarization process. In one embodiment, the contact-level dielectric layer 70 can include undoped silicate glass (e.g., silicon oxide) formed by decomposition of TEOS in a low pressure chemical vapor deposition (LPCVD) process. In another embodiment, the contact-level dielectric layer 70 can include doped silicate glass (such as borophosphosilicate glass, borosilicate glass, phosphosilicate glass, or arsenosilicate glass), or porous or non-porous organosilicate glass. In another embodiment, the contact-level dielectric layer 70 may include a high dielectric constant material which has a dielectric constant higher than that of silicon oxide. For example, the high dielectric constant material may include silicon nitride or a metal oxide, such as aluminum oxide or hafnium oxide. The high dielectric constant material may improve the on-current of the transistor, as will be described in more detail below.

In one embodiment, a planarized horizontal surface of the contact-level dielectric layer 70 can be formed above the horizontal plane including the top surface of the gate cap dielectric 58. The vertical distance between the planarized top surface of the contact-level dielectric layer 70 and the top surface of the semiconductor substrate 8 can be in a range from 150 nm to 600 nm, although lesser and greater vertical distances can also be employed.

A photoresist layer (not shown) can be applied over the contact-level dielectric layer 70, and can be lithographically patterned to form contact openings in areas that overlie the source region 32, the drain region 38, and the gate electrode (52, 54). An anisotropic etch process can be performed to transfer the pattern in the photoresist layer through the contact-level dielectric layer 70. The chemistry of the anisotropic etch process can be selective to the materials of the source regions 32, the drain region 38, and the gate electrode (52, 54). The gate cap dielectric 58 may be employed as an etch stop structure for a first step of the anisotropic etch process, and a final step of the anisotropic etch process can etch the material of the gate cap dielectric 58 selective to the material of the metallic gate electrode portion 54.

A source contact via cavity 72 can be formed over the source region 32, a drain contact via cavity 78 can be formed over the drain region 38, and a gate contact via cavity 75 can be formed over the gate electrode (52, 54). A top surface of the source region 32 can be physically exposed at the bottom of the source contact via cavity 72, a top surface of the drain region 38 can be physically exposed at the bottom of the drain contact via cavity 78, and a top surface of the gate electrode (52, 54) can be physically exposed at the bottom of the drain contact via cavity 75. The source contact via cavity 72 can have a straight sidewall that vertically extends from the top surface of the contact-level dielectric layer 70 to a top surface of the source region 32. The drain contact via cavity 78 can have a straight sidewall that vertically extends from the top surface of the contact-level dielectric layer 70 to a top surface of the drain region 38. The gate contact via cavity 75 can have a straight sidewall that vertically extends from the top surface of the contact-level dielectric layer 70 to a top surface of the gate electrode (52, 54). The cavities may have a tapered shape which is narrower at the bottom than at the top. The photoresist layer can be removed, for example, by ashing.

Referring to FIGS. 7A-7C, a metal that forms a metal-semiconductor alloy may be optionally deposited into each of the source contact cavity 72, the drain contact cavity 78, and the gate contact cavity 75. An isotropic deposition process (such as a chemical vapor deposition process) or an anisotropic deposition process (such as physical vapor deposition process) can be employed to deposit the metal. The metal can include, for example, tungsten, titanium, nickel, or a combination thereof. The thickness of the deposited metal over the top surfaces of the source region 32, the drain region 38, and the gate electrode (52, 54) can be in a range from 5 nm to 50 nm, although lesser and greater thicknesses can also be employed. An anneal process can be performed to induce formation of a metal-semiconductor alloy (i.e., metal silicide) by reaction of the metal and the semiconductor material of the source region 32 and the drain region 38, and with the semiconductor material of the semiconductor gate electrode portion 52 in case the metallic gate electrode portion 54 is not employed. Unreacted portions of the metal can be removed by a wet etch process that etches the metal selective to the metal-semiconductor alloy. A source-side metal-semiconductor alloy region 42 can be formed on the top surface of the source region 32. A drain-side metal-semiconductor alloy region 48 can be formed on the top surface of the drain region 38. In case the metallic gate electrode portion 54 is not employed, a gate metal-semiconductor alloy region (not shown) can be formed on the semiconductor gate electrode portion 52. If the semiconductor comprises silicon, then the metal-semiconductor alloy comprises a metal silicide, such as tungsten silicide, titanium silicide, nickel silicide, etc.

At least one conductive material can be deposited in the remaining volumes of the source contact cavity 72, the drain contact cavity 78, and the gate contact cavity 75. For example, a metallic barrier material such as titanium, TiN, TaN, and/or WN can be deposited in the remaining volumes of the source contact cavity 72, the drain contact cavity 78, and the gate contact cavity 75. Subsequently, a metallic fill material such as W, Cu, Al, Ru, Co, and/or Mo can be deposited in remaining volumes of the source contact cavity 72, the drain contact cavity 78, and the gate contact cavity 75. Excess portions of the metallic fill material and the metallic barrier material can be removed from above the horizontal plane including the top surface of the contact-level dielectric layer 70 by a planarization process such as chemical mechanical planarization. Each remaining portion of the metallic barrier material constitutes a metallic barrier liner (82L, 85L, 88L). Each remaining portion of the metallic fill material constitutes a metallic fill material portion (82F, 85F, 88F).

A source contact via structure 82 is thus formed in the source via cavity 72. The source contact via structure 82 can include a source-side metallic barrier layer 82L and a source-side metallic fill material portion 82F. A drain contact via structure 88 is formed in the drain via cavity 78. The drain contact via structure 88 can include a drain-side metallic barrier layer 88L and a drain-side metallic fill material portion 88F. A gate contact via structure 85 is formed in the gate via cavity 75. The gate contact via structure 85 can include a gate-side metallic barrier layer 85L and a gate-side metallic fill material portion 85F.

The source contact via structure 82 is formed through the contact-level dielectric layer 70. The source contact via structure 82 is electrically connected to the source region 32, and has a planar top surface within a horizontal plane including the top surface of the contact-level dielectric layer 70. The drain contact via structure 88 is formed through the contact-level dielectric layer 70. The drain contact via structure 88 is electrically connected to the drain region 38, and has a planar top surface within the horizontal plane including the top surface of the contact-level dielectric layer 70. The gate contact via structure 85 is formed through the contact-level dielectric layer 70. The gate contact via structure 85 is electrically connected to the gate electrode (52, 54), and has a planar top surface within the horizontal plane including the top surface of the contact-level dielectric layer 70.

Figure 8A:
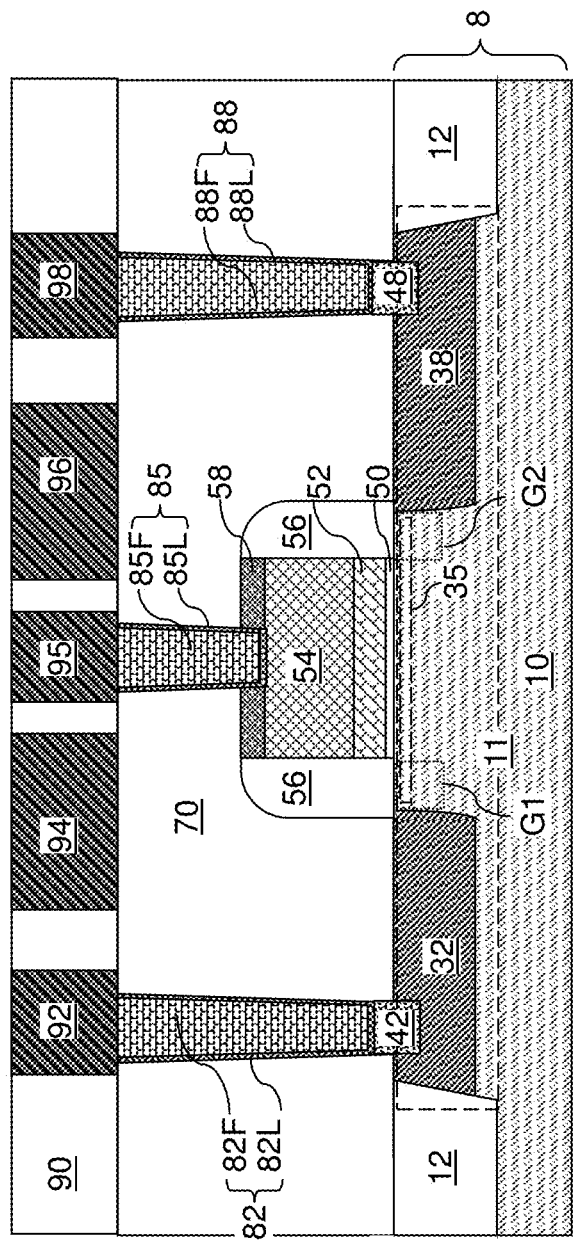
FIG. 8A is a vertical cross-sectional view of the alternate embodiment of the first exemplary structure after formation of metallic plates according to an embodiment of the present disclosure.
Figure 8B:
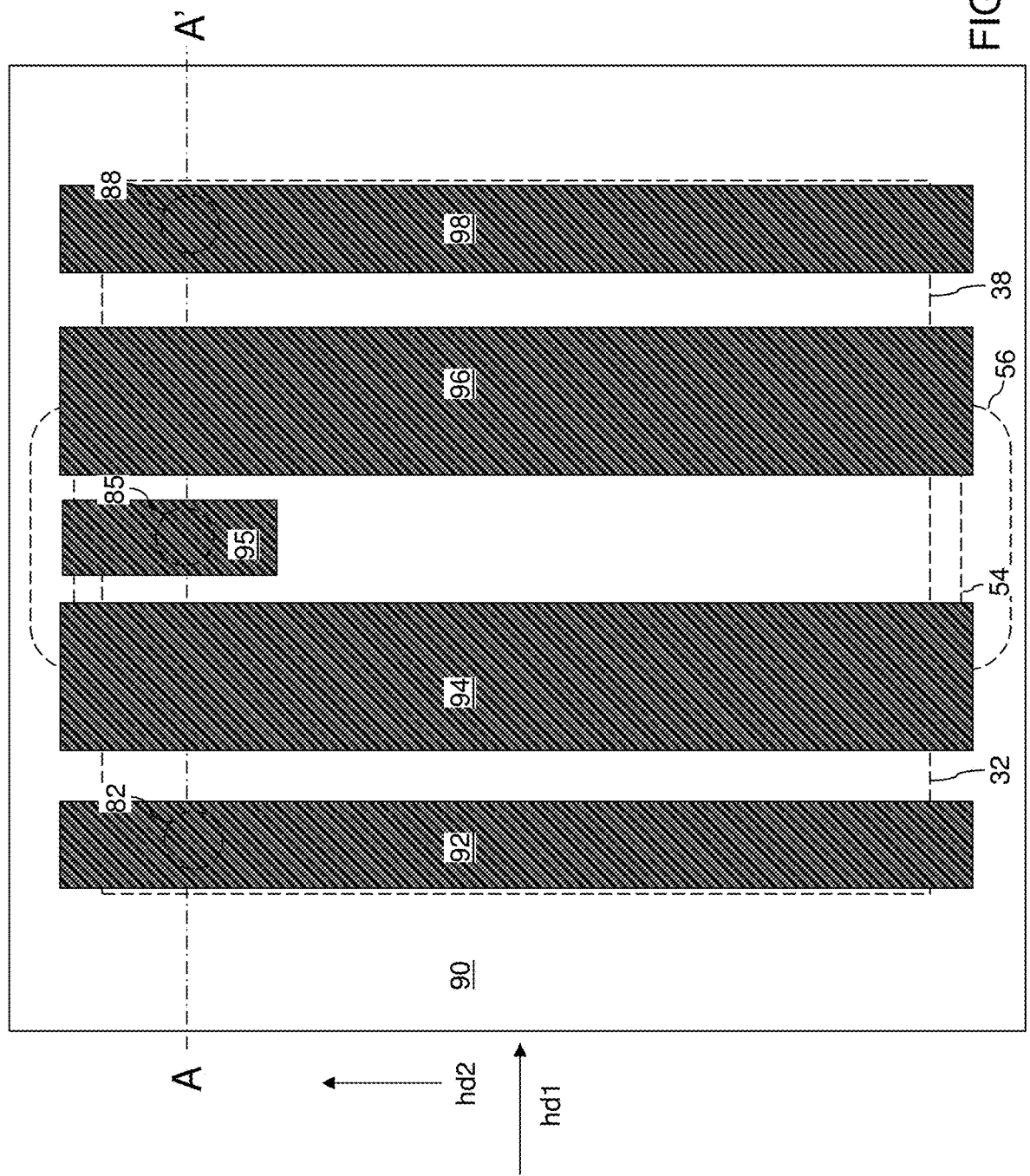
FIG. 8B is a vertical cross-sectional view along the vertical plane B-B' of FIG. 8A.

Referring to FIGS. 8A and 8B, a line-level dielectric layer 90 can be deposited over the contact-level dielectric layer 70. The line-level dielectric layer 90 includes a dielectric material such as undoped silicate glass, a doped silicate glass, or organosilicate glass. The line-level dielectric layer 90 may be deposited by a conformal or non-conformal deposition process. The thickness of the line-level dielectric layer 90 can be in a range from 100 nm to 300 nm, although lesser and greater thicknesses can also be employed.

A photoresist layer can be formed over the line-level dielectric layer 90, and can be lithographically patterned to form various openings therethrough. An anisotropic etch process can be performed to transfer the pattern in the photoresist layer through the line-level dielectric layer 90. Various line cavities can be formed through the line-level dielectric layer 90. Each of the contact via structures (88, 85, 88) can have a top surface that is physically exposed to a respective one of the line cavities. The photoresist layer can be subsequently removed, for example, by ashing.

At least one conductive material can be deposited in the line cavities. For example, a conductive metallic liner including a metallic nitride material (such as TiN, TaN, or WN) can be deposited in the line cavities. The thickness of the conductive metallic liner can be in a range from 5 nm to 20 nm, although lesser and greater thicknesses can also be employed. A metallic fill material can be deposited over the conductive metallic liner to fill remaining volumes of the line cavities. The metallic fill material includes a metallic fill material such as copper, tungsten, molybdenum, ruthenium, cobalt, an alloy thereof, or a layer stack thereof. Excess portions of the at least one conductive material can be removed from above the horizontal plane including the top surface of the line-level dielectric layer 90. Each remaining portion of the at least one conductive material in a respective one of the line cavities comprises a metallic plate (92, 94, 95, 96, 98).

While a damascene process of forming the metallic plates is described above, in an alternative embodiment, the metallic plates may be formed by patterning and etching. In the alternative embodiment, the conductive metallic liner and fill layers are formed over the contact-level dielectric layer 70 and in contact with the top surfaces of the contact via structures (82, 85, 88). The conductive metallic liner and fill layers are then etched using a patterned photoresist layer to form the metallic plates (92, 94, 95, 96, 98). After removing the patterned photoresist layer, the line-level dielectric layer 90 is formed between and over the metallic plates (92, 94, 95, 96, 98). The line-level dielectric layer 90 is then planarized (e.g., by CMP) so that its top surface is co-planar with the top surfaces of the metallic plates (92, 94, 95, 96, 98).

The metallic plates (92, 94, 95, 96, 98) comprise an electrically conductive material and may include a source-side metallic plate 92 that is formed directly on the planar top surface of the source contact via structure 82, a drain-side metallic plate 98 that is formed directly on the planar top surface of the drain contact via structure 88, and a gate-side metallic plate 95 that is formed directly on the planar top surface of the gate contact via structure 85. Generally, the metallic plates (92, 94, 95, 96, 98) are formed directly on a top surface of the contact-level dielectric layer 70. The metallic plates (92, 94, 95, 96, 98) also include at least one assist-field metallic plate having an areal overlap with the entirety of the first gap region G1 and/or with the entirety of the second gap region G2 in a plan view.

In one embodiment, the at least one assist-field metallic plate (94, 96) can be different from the source-side metallic plate 92, the drain-side metallic plate 98, and the gate-side metallic plate 95. For example, a first assist-field metallic plate 94 having an areal overlap with the first gap region G1 can be formed between the source-side metallic plate 92 and the gate-side metallic plate 95, and a second assist-field metallic plate 96 having an areal overlap with the second gap region G2 can be formed between the drain-side metallic plate 98 and the gate-side metallic plate 95. In one embodiment, the first assist-field metallic plate 94 can have an areal overlap with the entire area of the first gap region G1, and the second assist-field metallic plate 96 can have an areal overlap with the entire area of the second gap region G2. The first assist-field metallic plate 94 can be located between the source-side metallic plate 92 and the gate-side metallic plate 95, and the second assist-field metallic plate 96 can be located between the drain-side metallic plate 98 and the gate-side metallic plate 95.

In one embodiment, the first assist-field metallic plate 94 has an areal overlap with a portion of the source region 32 and with a first portion of the gate electrode (52, 54) in the plan view, and the second assist-field metallic plate 96 has an areal overlap with a portion of the drain region 38 and with a second portion of the gate electrode (52, 54) in the plan view. In one embodiment, each of the first assist-field metallic plate 94 and the second assist-field metallic plate 96 can be electrically isolated from the source-side metallic plate 92, the drain-side metallic plate 98, and the gate-side metallic plate 95.

In one embodiment, each of the first assist-field metallic plate 94 and the second assist-field metallic plate 96 can be configured to be independently electrically biased. In this case, each of the first assist-field metallic plate 94 and the second assist-field metallic plate 96 can be connected to an output node (such as a source region or a drain region) of a respective control field effect transistor. For example, the first assist-field metallic plate 94 can be electrically connected to an output node of a first control field effect transistor, and the second assist-field metallic plate 96 can be electrically connected to an output node of a second control field effect transistor, and the first assist-field metallic plate 94 and the second assist-field metallic plate 96 can be independently electrically biased by the two control field effect transistors. The first assist-field metallic plate 94 and the second assist-field metallic plate 96 are also biased independently from the source-side metallic plate 92, the drain-side metallic plate 98, and the gate-side metallic plate 95.

In another embodiment, the first assist-field metallic plate 94 and the second assist-field metallic plate 96 can be configured to be electrically biased with a same bias voltage. In this case, each of the first assist-field metallic plate 94 and the second assist-field metallic plate 96 can be connected to an output node of a same control field effect transistor, and the first assist-field metallic plate 94 and the second assist-field metallic plate 96 can are electrically biased together by the same control field effect transistor. However, the first assist-field metallic plate 94 and the second assist-field metallic plate 96 are biased independently from the source-side metallic plate 92, the drain-side metallic plate 98, and the gate-side metallic plate 95.

The first assist-field metallic plate 94 and the second assist-field metallic plate 96 can be employed to provide an assist electric field to the first gap region G1 and the second gap region G2, respectively. The polarity and the magnitude of the voltage applied to the first assist-field metallic plate 94 and the second assist-field metallic plate 96 can be selected to enhance the on-current through the channel region 35 (and thus in the gap regions) when the field effect transistor is turned on.

Figure 9A:
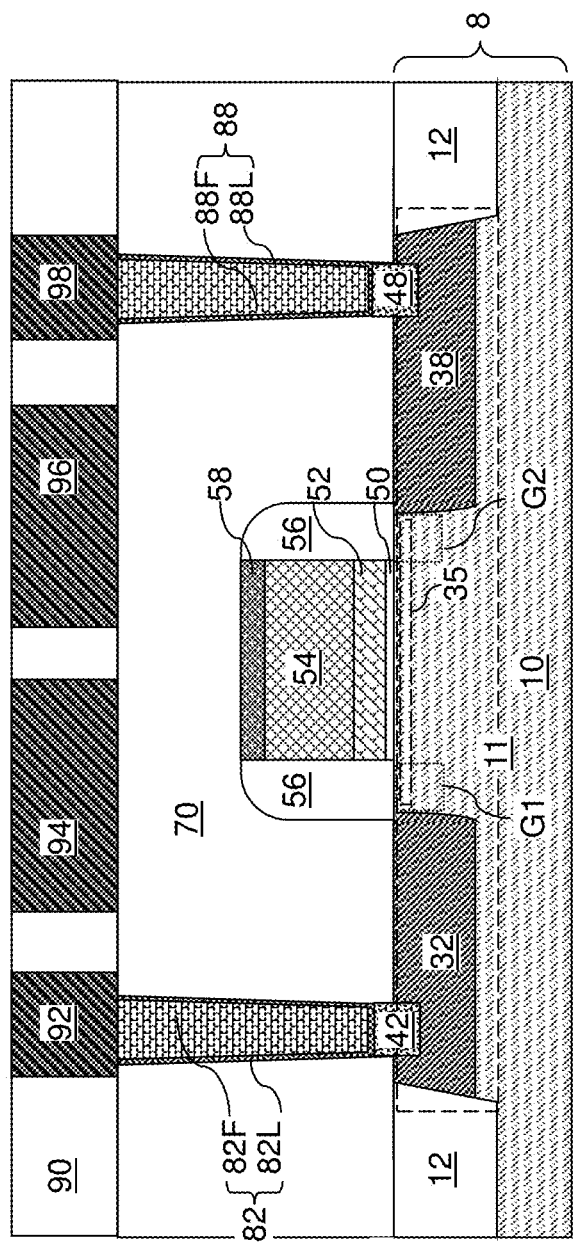
FIG. 9A is a vertical cross-sectional view of a second exemplary structure after formation of metallic plates according to an embodiment of the present disclosure.

Referring to FIGS. 9A and 9B, a second exemplary structure is illustrated after formation of metallic plates (92, 94, 95, 96, 98). The second exemplary structure can be derived from the first exemplary structure by changing the layout for the gate-side metallic plate 95, first assist-field metallic plate 94, and the second assist-field metallic plate 96. In this embodiment, the gate-side metallic plate 95 can be laterally offset from the first assist-field metallic plate 94 and the second assist-field metallic plate 96 along the second horizontal direction hd2. In one embodiment, the gate-side metallic plate 95 may overlie a portion of the gate electrode (52, 54) that overlies the shallow trench isolation structure 12, and may not have an areal overlap with the area of the transistor body region 11.

Figure 10A:
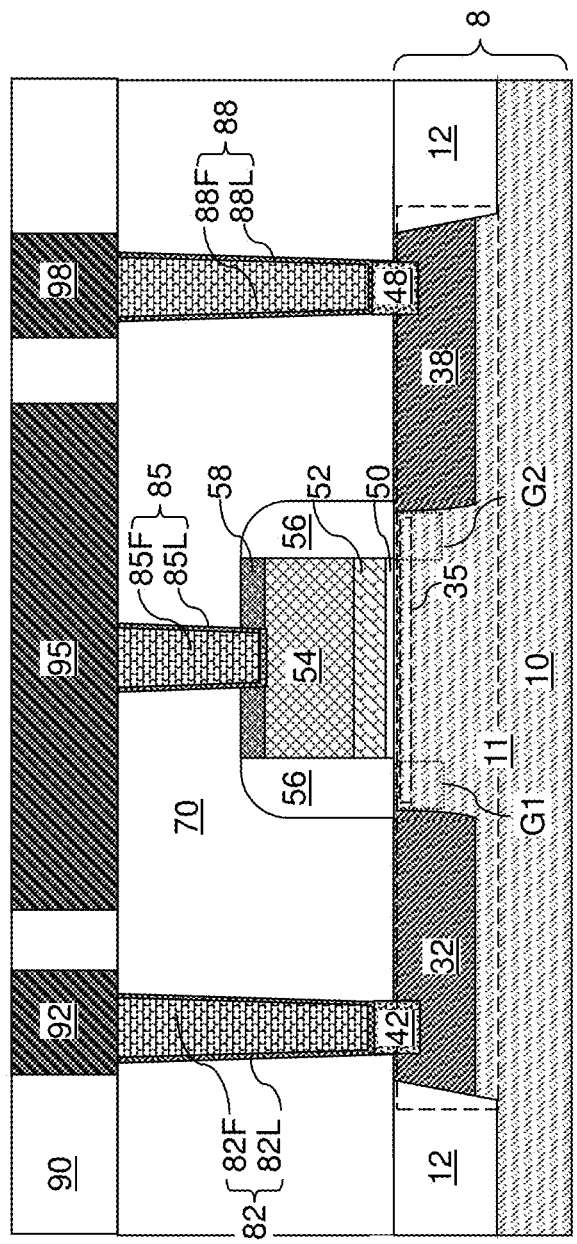
FIG. 10A is a vertical cross-sectional view of a third exemplary structure after formation of metallic plates according to an embodiment of the present disclosure.
Figure 10B:
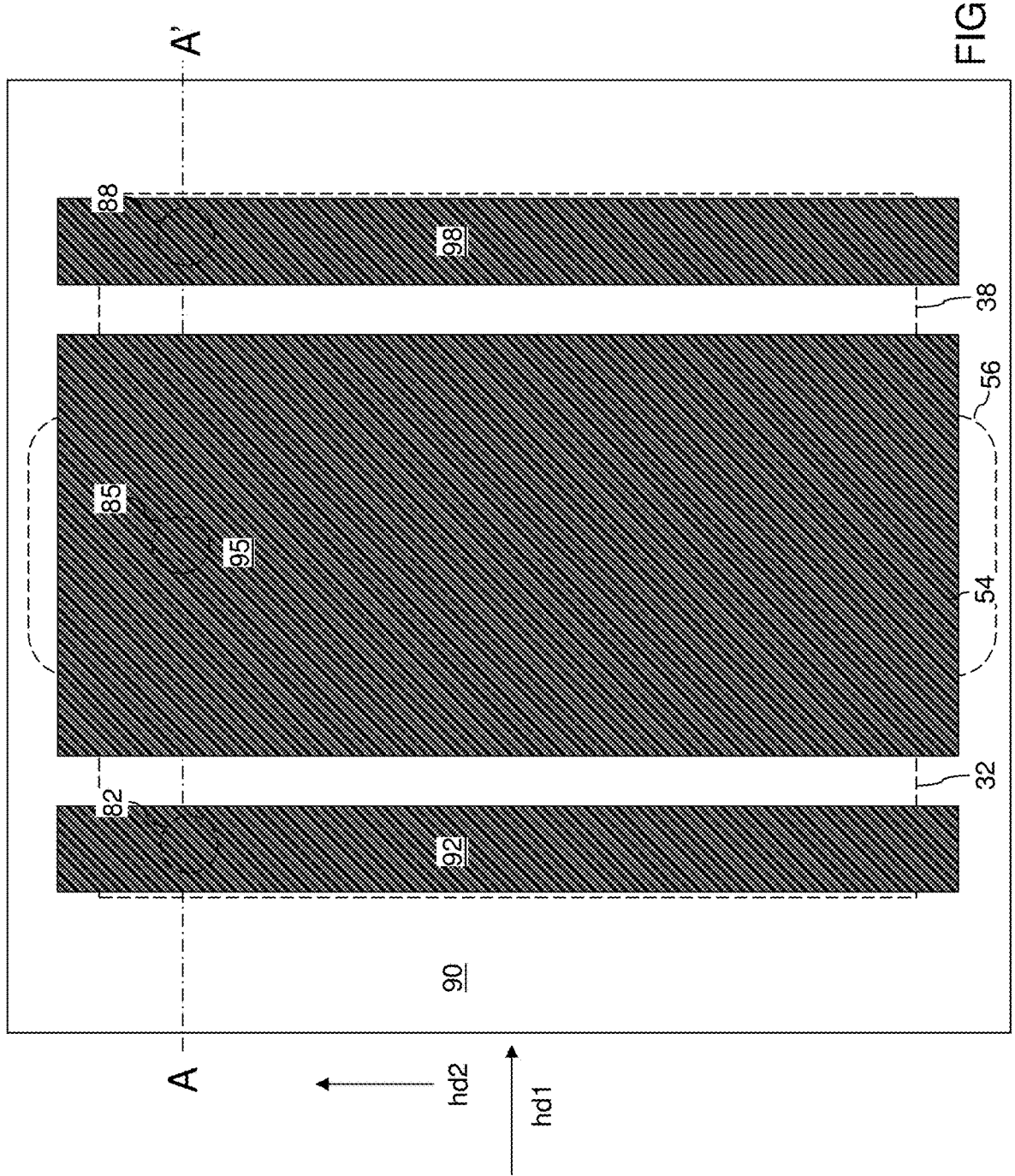
FIG. 10B is a vertical cross-sectional view along the vertical plane B-B' of FIG. 10A.

Referring to FIGS. 10A and 10B, a third exemplary structure according to an embodiment of the present disclosure can be derived from the first exemplary structure illustrated in FIGS. 8A and 8B by merging the first assist-field metallic plate 94 and the second assist-field metallic plate 96 with the gate-side metallic plate 95. For example, the single gate-side metallic plate 95 can extend over the first gap region G1 and the second gap region G2. The single gate-side metallic plate 95 is wider than the gate electrode (52, 54) along the first horizontal direction hd1 (i.e., along the source to drain direction). The lateral portions of the single gate-side metallic plate 95 function as the first and second assist-field metallic plates.

The gate-side metallic plate 95 which functions as the first and second assist-field metallic plates is different from and is electrically isolated from the source-side metallic plate 92 and the drain-side metallic plate 98. The gate-side metallic plate 95 which functions as the first and second assist-field metallic plates has an areal overlap with the first gap region G1 and with the second gap region G2. The gate-side metallic plate 95 which functions as the first and second assist-field metallic plates can continuously extend from a region overlying a proximal portion of the source region 32 that is proximal to the gate electrode (52, 54) to a region overlying a proximal portion of the drain region 38 that is proximal to the gate electrode (52, 54). In one embodiment, the gate-side metallic plate 95 which functions as the first and second assist-field metallic plates can have an areal overlap with the entire area of the first gap region G1, the entire area of the second gap region G2, and the entire area of the channel region 35. The gate-side metallic plate 95 which functions as the first and second assist-field metallic plates can have an areal overlap with the proximal portion of the source region 32, and the proximal portion of the drain region 38.

The gate-side metallic plate 95 which functions as the first and second assist-field metallic plates can be employed to provide an assist electric field to the first gap region G1 and the second gap region G2 during operation of the field effect transistor when a voltage is applied to the gate electrode (52, 54) from the gate-side metallic plate 95 through the via structure 85. The polarity and the magnitude of the voltage applied to the gate-side metallic plate 95 can be selected to enhance the on-current through the channel region 35 when the field effect transistor is turned on.

Figure 11A:
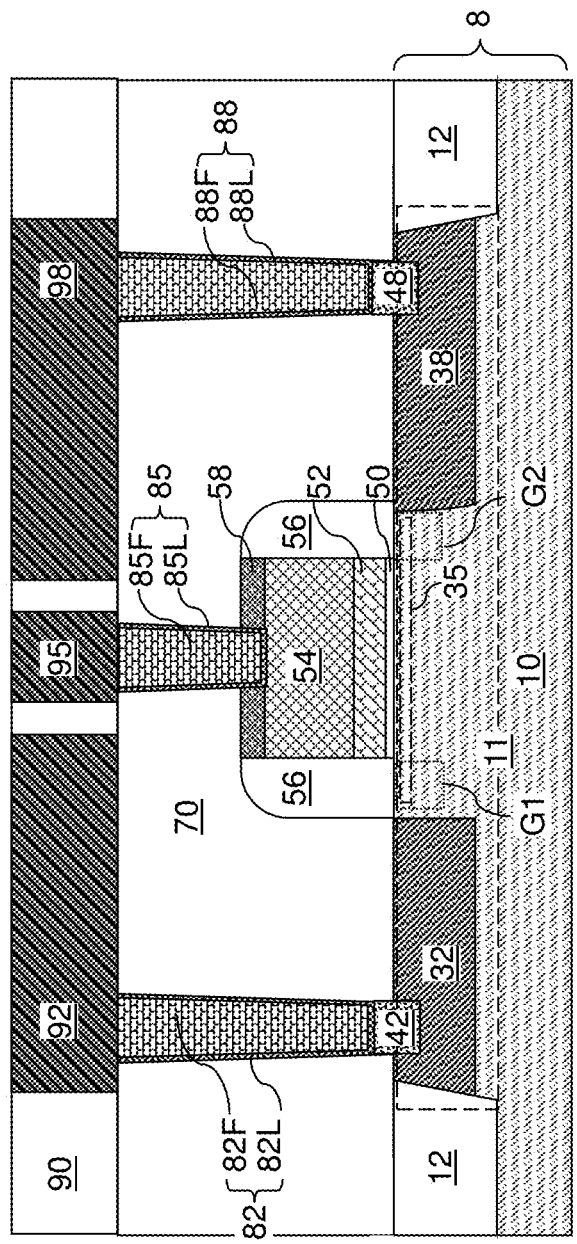
FIG. 11A is a vertical cross-sectional view of a fourth exemplary structure after formation of metallic plates according to an embodiment of the present disclosure.
Figure 11B:
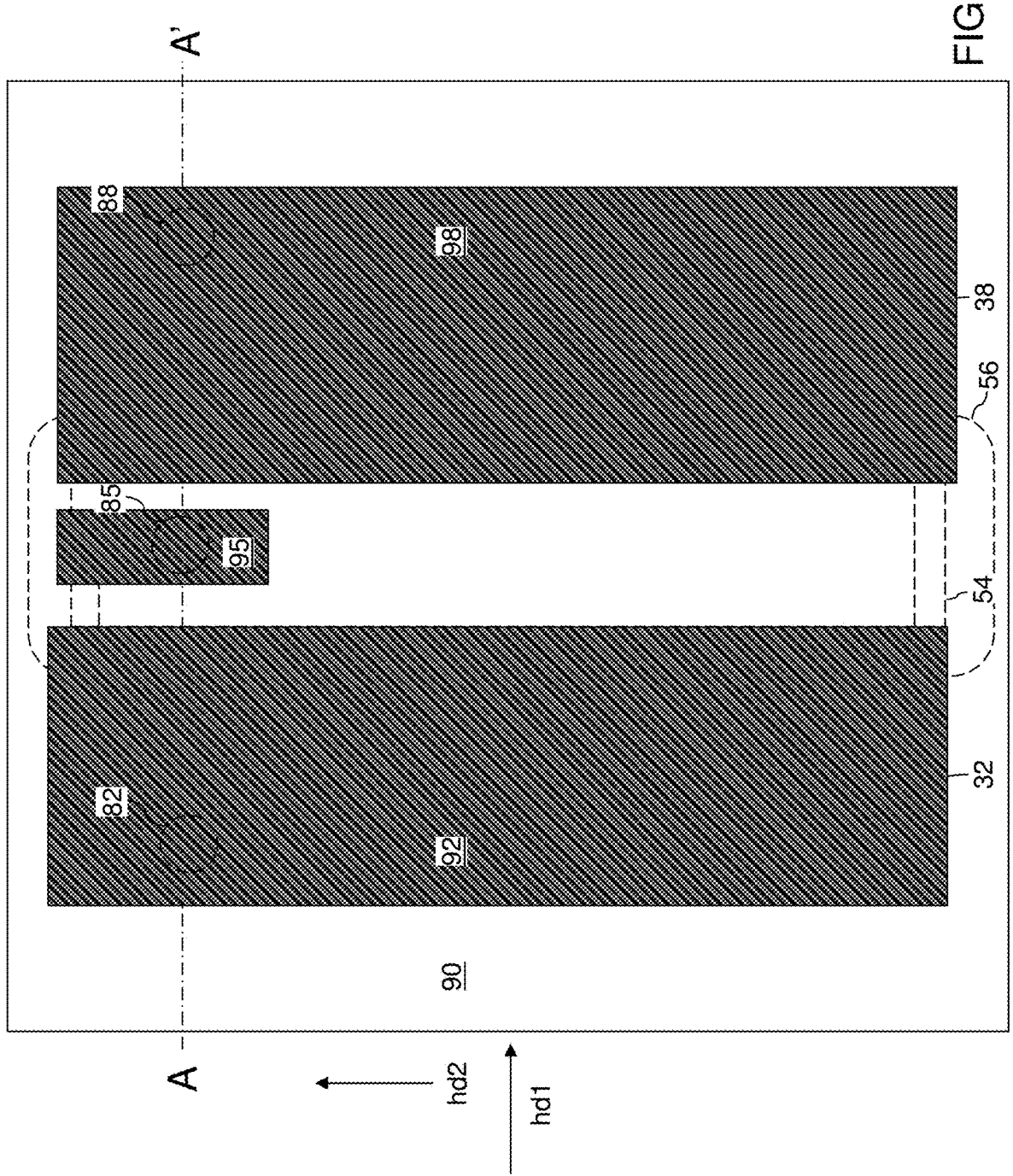
FIG. 11B is a vertical cross-sectional view along the vertical plane B-B' of FIG. 11A.

Referring to FIGS. 11A and 11B, a fourth exemplary structure according to an embodiment of the present disclosure can be derived from the first exemplary structure of FIGS. 8A and 8B by merging the source-side metallic plate 92 and the first assist-field metallic plate 94, and by merging the drain-side metallic plate 98 and the second assist-field metallic plate 96. For example, the source-side metallic plate 92 of the first exemplary structure can be laterally extended along the first horizontal direction hd1 toward the drain-side metallic plate 98 until an edge of the source-side metallic plate 92 overlies a first peripheral portion of the gate electrode (52, 54). The source-side metallic plate 92, as extended in the fourth exemplary structure, functions as a first assist-field metallic plate that enhances the on-current of the field effect transistor when the field effect transistor is turned on. Likewise, the drain-side metallic plate 98 of the first exemplary structure can be laterally extended along the first horizontal direction hd1 toward the source-side metallic plate 92 until an edge of the drain-side metallic plate 98 overlies a second peripheral portion of the gate electrode (52, 54). The drain-side metallic plate 98, as extended in the fourth exemplary structure, functions as a second assist-field metallic plate that enhances the on-current of the field effect transistor when the field effect transistor is turned on.

In the fourth exemplary structure, the first assist-field metallic plate may comprise a portion of the source-side metallic plate 92, and the second assist-field metallic plate may comprise a portion of the drain-side metallic plate 98. Thus, the first assist-field metallic plate can be the same as the source-side metallic plate 92, and the second assist-field metallic plate can be the same as the drain-side metallic plate 98. The first assist-field metallic plate (comprising a portion of the source-side metallic plate 92) can have an areal overlap with the first gap region G1, and the second assist-field metallic plate (comprising a portion of the drain-side metallic plate 98) can have an areal overlap with the second gap region G2.

The first assist-field metallic plate (comprising the portion of the source-side metallic plate 92) can continuously extend from a region overlying the source region 32 to a region overlying a first peripheral portion of the gate electrode (52, 54) and proximal to the source region 32. The second assist-field metallic plate (comprising the portion of the drain-side metallic plate 98) can continuously extend from a region overlying the drain region 38 to a region overlying a second peripheral portion of the gate electrode (52, 54) and proximal to the drain region 38. In one embodiment, the first assist-field metallic plate (comprising the portion of the source-side metallic plate 92) can have an areal overlap with the entire area of the first gap region G1, and the second assist-field metallic plate (comprising the portion of drain-side metallic plate 98) cam have an areal overlap with the entire area of the second gap region G2.

The first assist-field metallic plate (comprising the portion of the source-side metallic plate 92) can be employed to provide a first assist electric field to the first gap region G1 during operation of the field effect transistor when a voltage is applied to the source-side metallic plate 92. The second assist-field metallic plate (comprising the portion of the drain-side metallic plate 98) can be employed to provide a second assist electric field to the second gap region G2 during operation of the field effect transistor when a voltage is applied to the drain-side metallic plate 98.

In one embodiment, the source-side metallic plate 92 has an areal overlap with an entirety of the source region 32 and a first portion of the gate electrode (52, 54), and the drain-side metallic plate 98 has an areal overlap with an entirety of the drain region 38 and a second portion of the gate electrode (52, 54).

Figure 12B:
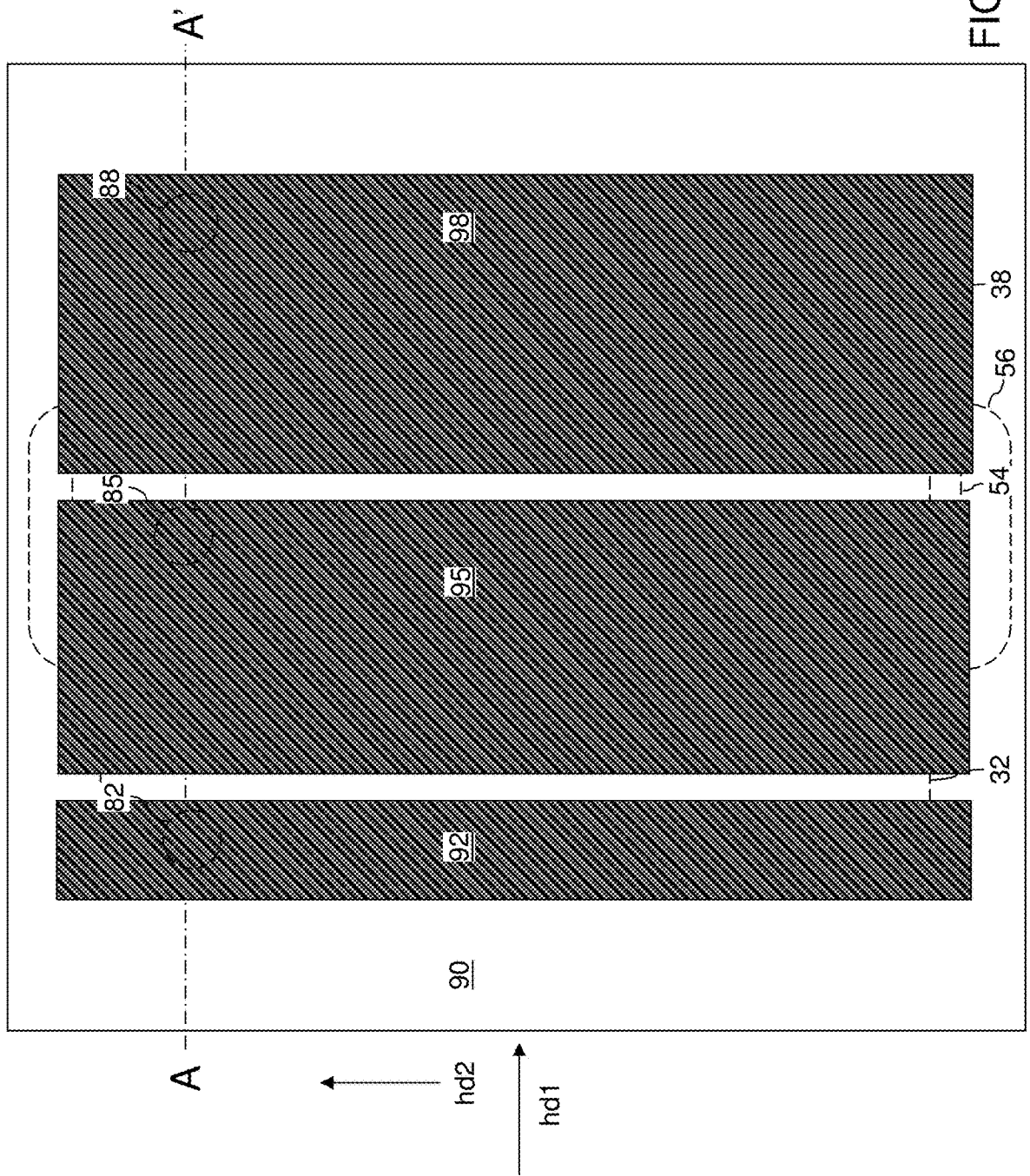
FIG. 12B is a vertical cross-sectional view along the vertical plane B-B' of FIG. 12A.

Referring to FIGS. 12A and 12B, a fifth exemplary structure according to an embodiment of the present disclosure can be derived from the first exemplary structure of FIGS. 8A and 8B by merging one assist-field metallic plate of the first exemplary structure into the gate-side metallic plate 95 of the first exemplary structure, and by merging another assist-field metallic plate into one of the source-side metallic plate 92 or the drain-side metallic plate 98. For example, as shown in FIGS. 12A and 12B, the first assist-field metallic plate 94 of the first exemplary structure is merged into the gate-side metallic plate 95 of the first exemplary structure, and the second assist-field metallic plate 96 is merged into the drain-side metallic plate 98

For example, the first assist-field metallic plate 94 of the first exemplary structure can be laterally extended toward the gate-side metallic plate 95, and can be incorporated into the gate-side metallic plate 95. Thus, a first assist-field metallic plate of the fifth exemplary structure comprises a portion of the gate-side metallic plate 95 of the fifth exemplary structure. The first assist-field metallic plate comprises the portion of the gate-side metallic plate 95 having an areal overlap with a portion of the source region 32 and a portion of the gate electrode (52, 54). The portion of the gate-side metallic plate 95, as extended in the fifth exemplary structure, functions as a first assist-field metallic plate that enhances the on-current of the field effect transistor when the field effect transistor is turned on.

Further, the second assist-field metallic plate 96 of the first exemplary structure can be laterally extended toward the drain-side metallic plate 98, and can be incorporated into the drain-side metallic plate 98. Thus, a second assist-field metallic plate of the fifth exemplary structure comprises a portion of the drain-side metallic plate 98 of the fifth exemplary structure. The second assist-field metallic plate comprises the portion of the drain-side metallic plate having an areal overlap with an entirety of the drain region and a portion of the gate electrode. The portion of the drain-side metallic plate 98, as extended in the fifth exemplary structure, functions as a second assist-field metallic plate that enhances the on-current of the field effect transistor when the field effect transistor is turned on.

In the fifth exemplary structure, the first assist-field metallic plate comprises a portion of the gate-side metallic plate 95, and the second assist-field metallic plate comprises a portion of the drain-side metallic plate 98. Thus, the first assist-field metallic plate can be the same as the gate-side metallic plate 95, and the second assist-field metallic plate can be the same as the drain-side metallic plate 98. The first assist-field metallic plate (comprising the portion of the gate-side metallic plate 95) can have an areal overlap with the first gap region G1, and the second assist-field metallic plate (comprising the portion of the drain-side metallic plate 98) can have an areal overlap with the second gap region G2.

The first assist-field metallic plate (comprising the portion of the gate-side metallic plate 95) can continuously extend from a region overlying a peripheral portion of the source region 32 to a region overlying a first peripheral portion of the gate electrode (52, 54) and proximal to the source region 32. The second assist-field metallic plate (comprising the portion of the drain-side metallic plate 98) can continuously extend from a region overlying the drain region 38 to a region overlying a second peripheral portion of the gate electrode (52, 54) and proximal to the drain region 38. In one embodiment, the first assist-field metallic plate (comprising the portion of the gate-side metallic plate 95) can have an areal overlap with the entire area of the first gap region G1, and the second assist-field metallic plate (comprising the portion of the drain-side metallic plate 98) cam have an areal overlap with the entire area of the second gap region G2.

The first assist-field metallic plate (comprising the portion of the gate-side metallic plate 95) can be employed to provide a first assist electric field to the first gap region G1 during operation of the field effect transistor. The second assist-field metallic plate (comprising the portion of the drain-side metallic plate 98) can be employed to provide a second assist electric field to the second gap region G2 during operation of the field effect transistor.

Figure 13:
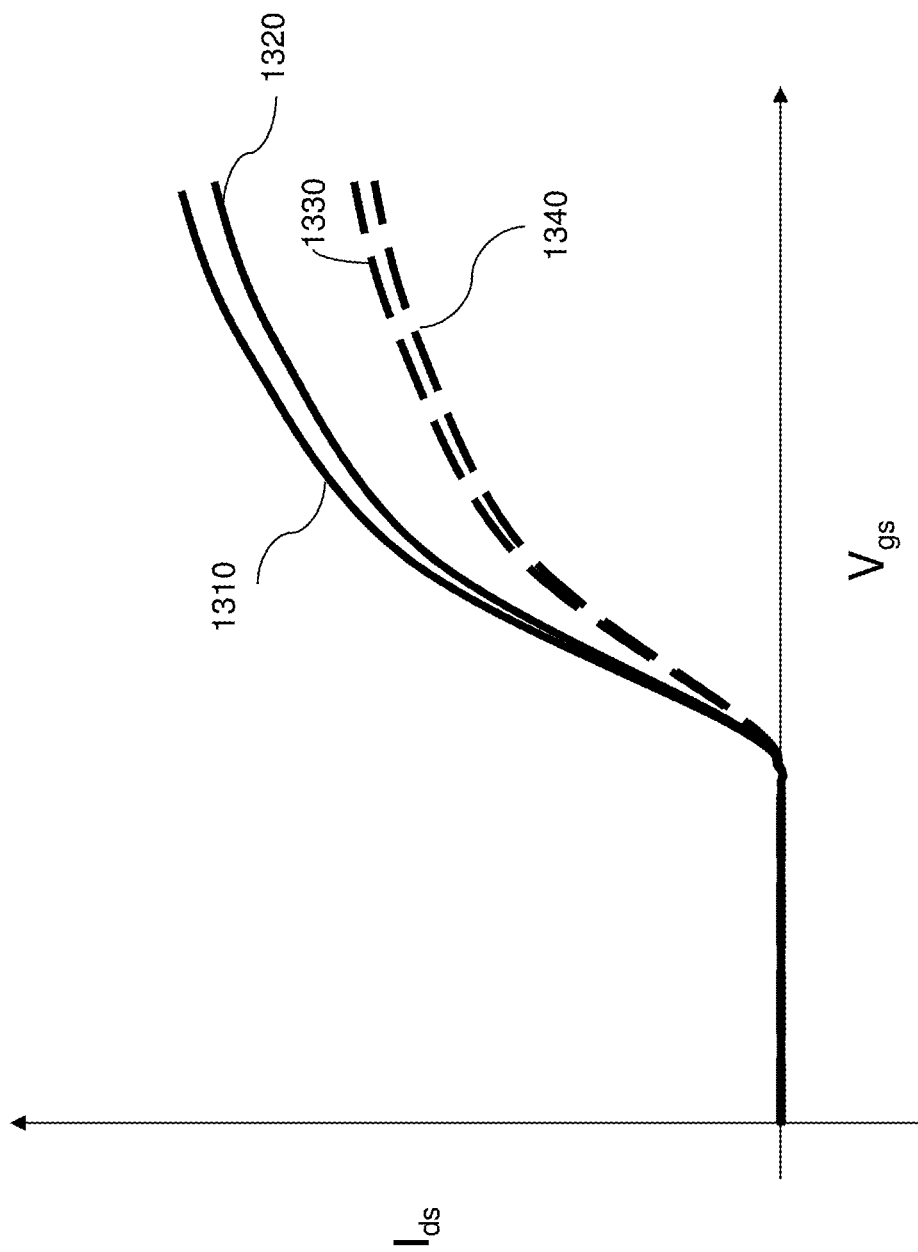
FIG. 13 is a graph illustrating the effect of an assist electric field on the source-drain current of a field effect transistor as a function of a gate voltage according to an embodiment of the present disclosure.

FIG. 13 illustrates computer modeled channel currents Ids (i.e., on-current) as a function of a gate voltage Vgs for various transistor configurations. The channel current Ids as a function of a gate voltage Vgs of the field effect transistor of the third embodiment of the present disclosure having the third exemplary structure shown in FIGS. 10A and 10B during operation of the transistor which includes application of a gate voltage to the gate-side metallic plate 95 is schematically represented by a first curve 1310.

The channel current Ids as a function of a gate voltage Vgs of the field effect transistor of the fourth embodiment of the present disclosure having the fourth exemplary structure shown in FIGS. 11A and 11B during operation of the transistor which includes application of a drain voltage to the drain-side metallic plate 98 is schematically represented by a second curve 1320.

The channel current Ids as a function of a gate voltage Vgs of the field effect transistor of the first embodiment of the present disclosure having the first exemplary structure shown in FIGS. 8A and 8B during operation of the transistor but with no voltage applied to the first and second assist-field metallic plates (94, 96) is schematically represented by a third curve 1330.

The channel current Ids as a function of a gate voltage Vgs of a comparative field effect transistor which lacks any assist-field metallic plates during operation of the transistor is schematically represented by a fourth curve 1340.

As shown in FIG. 13, application of a voltage to an assist-field metallic plate during to generate an assist field during operation of the transistor significantly improves the on-current of the transistor. For example, an at least 71% and 58% respective improvement in on-current for the third and fourth embodiment transistors compared to the comparative example transistor based on curves 1310, 1320 and 1340. However, the presence of the assist-field metallic plates without application of a voltage to these plates provides only a small increase in the on-current based on curves 1330 and 1340. Thus, the channel current Ids of the field effect transistor of the embodiments of the present disclosure can be increased by applying voltages to the assist-field metallic plate(s) 94 to generate electric assist fields that improve flow of the electrical current through the first gap region G1 and the second gap region G2.

Referring to all drawings and according to various embodiments of the present disclosure, a semiconductor structure includes a source region 32, a drain region 38, a channel region 35 located between the source region and the drain region, a gate stack structure (50, 52, 54, 58) including a gate dielectric 50 and a gate electrode (52, 54) that overlies the gate dielectric, such that a first gap region G1 is present between an area of the source region and an area of the gate electrode in a plan view and a second gap region G2 is present between an area of the drain region and the area of the gate electrode in the plan view, a contact-level dielectric layer 70 overlying the source region and the drain region and laterally surrounding the gate stack structure, and at least one assist-field metallic plate (94, 96, 92, 95, 98) located vertically above a top surface of the gate electrode (52, 54) and having an areal overlap with at least one of the first gap region G1 and the second gap region G2 in the plan view.

In one embodiment, gate sidewall spacers 56 are located on sidewalls of the gate electrode (52, 54) and have an areal overlap with an entirety of the first gap region G1 and the second gap region G2 in the plan view. In one embodiment, a semiconductor transistor body region 11 is laterally surrounded by a shallow trench isolation structure 12. In one embodiment, the channel region 35, the source region 32 and the drain region 38 are located in the transistor body region 11. The transistor body region 11 has a rectangular horizontal cross-sectional shape. Each of the first gap region G1 and the second gap region G1 has a respective rectangular shape in the plan view.

In one embodiment, the semiconductor transistor body region 11 and thus the channel region 35 comprise crystalline (e.g., single crystalline or polycrystalline) silicon, and the contact-level dielectric layer 70 has a dielectric constant higher than 3.9 (i.e., higher than the dielectric constant of silicon oxide) to enhance the assist field. The contact-level dielectric layer 70 may comprise silicon nitride or a metal oxide, such as aluminum or hafnium oxide, which have a dielectric constant higher than 3.9 (e.g., a dielectric constant between 4 and 20).

In one embodiment, the at least one assist-field metallic plate contacts (94, 96, 92, 95, 98) a top surface of the contact-level dielectric layer 70. The source region 32 and the drain region 38 are laterally spaced apart along a first horizontal direction hd1, and the first gap region G1 and the second gap region G2 have a same width along the first horizontal direction hd1. A source contact via structure 82 is laterally surrounded by the contact-level dielectric layer 70 and electrically connected to the source region 32 and has a planar top surface. A drain contact via structure 88 is laterally surrounded by the contact-level dielectric layer 70 and electrically connected to the drain region 38 and has a planar top surface. A gate contact via structure 85 is laterally surrounded by the contact-level dielectric layer 70 and electrically connected to the gate electrode (52, 54) and has a planar top surface. A source-side metallic plate 92 contacts the planar top surface of the source contact via structure 82, a drain-side metallic plate 98 contacts the planar top surface of the drain contact via structure 88, and a gate-side metallic plate 95 contacts the planar top surface of the gate contact via structure 85.

In the first and second embodiments of the present disclosure, the at least one assist-field metallic plate (94, 96) is different from the source-side metallic plate 92, the drain-side metallic plate 98, and the gate-side metallic plate 95. The at least one assist-field metallic plate comprises a first assist-field metallic plate 94 located between the source-side metallic plate 92 and the gate-side metallic plate 95, and a second assist-field metallic plate 96 located between the drain-side metallic plate 98 and the gate-side metallic plate 95. The first assist-field metallic plate 94 has an areal overlap with a portion of the source region 32 and with a first portion of the gate electrode (52, 54) in the plan view. The second assist-field metallic plate 96 has an areal overlap with a portion of the drain region 38 and with a second portion of the gate electrode (52, 54) in the plan view. Each of the first assist-field metallic plate 94 and the second assist-field metallic plate 96 is electrically isolated from the source-side metallic plate 92, the drain-side metallic plate 98, and the gate-side metallic plate 95.

In the third, fourth and fifth embodiments, the at least one assist-field metallic plate comprises a portion of at least one of the source-side metallic plate 92, the drain-side metallic plate 98, and the gate-side metallic plate 95. In the third embodiment, the at least one assist-field metallic plate comprises the portion of the gate-side metallic plate 95 having an areal overlap with a portion of the source region 32, a portion of the drain region 38, and a portion of the gate electrode (52, 54). The at least one assist-field metallic plate overlies an entire area of the channel region 35, the first gap region G1, and the second gap region G2. 12. In the fourth embodiment, the least one assist-field metallic plate comprises the portion of the drain-side metallic plate 88 having an areal overlap with an entirety of the drain region 38 and a portion of the gate electrode (52, 54).

In one embodiment, a method of operating the semiconductor structure includes applying a drain voltage to the drain contact via structure 82 via the drain-side metallic plate 98, applying a gate voltage to the gate contact via structure 85 via the gate-side metallic plate 95, and applying a voltage to the at least one assist-field metallic plate to generate an assist field in at least one of the first gap region G1 and the second gap region G1 to increase a channel current flowing through the channel region 35. The voltage applied to the at least one assist-field metallic plate may comprise a separate voltage from a control transistor in the first and second embodiment, may comprise the gate voltage in the third and fifth embodiments, and may comprise the drain voltage in the fourth and fifth embodiments.

The various embodiments of the present disclosure can be employed to enhance the on-current of a field effect transistor without necessarily employing a source extension region or a drain extension region. Thus, processing steps for forming the source extension region or the drain extension region can be omitted during the manufacturing process. Further, the at least one assist-field metallic plate can be formed concurrently with the source-side metallic plate 92, the drain-side metallic plate 98, and/or the gate-side metallic plate 95 of the field effect transistor without employing any additional layer deposition step. Thus, increase in the on-current of the field effect transistor can be provided through the at least one assist-field metallic plate while reducing the total number of processing steps for forming the field effect transistor.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure, comprising:
a source region;
a drain region;
a channel region located between the source region and the drain region;
a gate stack structure including a gate dielectric that contacts a top surface of the channel region and a gate electrode that overlies the gate dielectric, wherein a first gap region is present between an area of the source region and an area of the gate electrode in a plan view and a second gap region is present between an area of the drain region and the area of the gate electrode in the plan view;
a contact-level dielectric layer overlying the source region and the drain region and laterally surrounding the gate stack structure; and
at least one assist-field metallic plate located vertically above a top surface of the gate electrode and having an areal overlap with at least one of the first gap region and the second gap region in the plan view.

2. The semiconductor structure of claim 1, further comprising gate sidewall spacers located on sidewalls of the gate electrode and having an areal overlap with an entirety of the first gap region and the second gap region in the plan view.

3. The semiconductor structure of claim 1, further comprising a semiconductor transistor body region laterally surrounded by a shallow trench isolation structure,
wherein:
the channel region, the source region and the drain region are located in the transistor body region;
the transistor body region has a rectangular horizontal cross-sectional shape;
each of the first gap region and the second gap region has a respective rectangular shape in the plan view;
the channel region comprises crystalline silicon; and
the contact-level dielectric layer has a dielectric constant higher than 3.9.

4. The semiconductor structure of claim 1, wherein:
the at least one assist-field metallic plate contacts a top surface of the contact-level dielectric layer;
the source region and the drain region are laterally spaced apart along a first horizontal direction; and
the first gap region and the second gap region have a same width along the first horizontal direction.

5. The semiconductor structure of claim 1, further comprising:
a source contact via structure that is laterally surrounded by the contact-level dielectric layer and electrically connected to the source region and having a planar top surface;
a drain contact via structure that is laterally surrounded by the contact-level dielectric layer and electrically connected to the drain region and having a planar top surface; and
a gate contact via structure that is laterally surrounded by the contact-level dielectric layer and electrically connected to the gate electrode and having a planar top surface.

6. The semiconductor structure of claim 5, further comprising:
a source-side metallic plate contacting the planar top surface of the source contact via structure;
a drain-side metallic plate contacting the planar top surface of the drain contact via structure; and
a gate-side metallic plate contacting the planar top surface of the gate contact via structure, wherein the at least one assist-field metallic plate is different from the source-side metallic plate, the drain-side metallic plate, and the gate-side metallic plate.

7. The semiconductor structure of claim 6, wherein the at least one assist-field metallic plate comprises:
a first assist-field metallic plate located between the source-side metallic plate and the gate-side metallic plate; and
a second assist-field metallic plate located between the drain-side metallic plate and the gate-side metallic plate.

8. The semiconductor structure of claim 7, wherein:
the first assist-field metallic plate has an areal overlap with a portion of the source region and with a first portion of the gate electrode in the plan view;
the second assist-field metallic plate has an areal overlap with a portion of the drain region and with a second portion of the gate electrode in the plan view;
each of the first assist-field metallic plate and the second assist-field metallic plate is electrically isolated from the source-side metallic plate, the drain-side metallic plate, and the gate-side metallic plate.

9. The semiconductor structure of claim 5, further comprising:
a source-side metallic plate contacting the planar top surface of the source contact via structure;
a drain-side metallic plate contacting the planar top surface of the drain contact via structure; and
a gate-side metallic plate contacting the planar top surface of the gate contact via structure,
wherein the at least one assist-field metallic plate comprises a portion of at least one of the source-side metallic plate, the drain-side metallic plate, and the gate-side metallic plate.

10. The semiconductor structure of claim 9, wherein the at least one assist-field metallic plate comprises the portion of the gate-side metallic plate having an areal overlap with a portion of the source region, a portion of the drain region, and a portion of the gate electrode.

11. The semiconductor structure of claim 10, wherein the at least one assist-field metallic plate overlies an entire area of the channel region, the first gap region, and the second gap region.

12. The semiconductor structure of claim 9, wherein the at least one assist-field metallic plate comprises the portion of the drain-side metallic plate having an areal overlap with an entirety of the drain region and a portion of the gate electrode.

13. A method of operating the semiconductor structure of claim 5, comprising:
applying a drain voltage to the drain contact via structure;
applying a gate voltage to the gate contact via structure; and
applying a voltage to the at least one assist-field metallic plate to generate an assist field in at least one of the first gap region and the second gap region to increase a channel current flowing through the channel region.

14. A method of forming a semiconductor structure, comprising:
forming a shallow trench isolation structure that laterally surrounds a transistor body region having a doping of a first conductivity type in a semiconductor substrate;
forming a gate stack structure including a gate dielectric and a gate electrode over the transistor body region;
forming a source region and a drain region having a doping of a second conductivity type that is an opposite of the first conductivity type in portions of the transistor body region that are laterally spaced from the gate stack structure, wherein a first gap region is present between an area of the source region and an area of the gate electrode in a plan view and a second gap region is present between an area of the drain region and the area of the gate electrode in the plan view, and a channel region laterally extends between the source region and the drain region;
forming a contact-level dielectric layer over the source region and the drain region and around the gate stack structure; and
forming at least one assist-field metallic plate directly on a top surface of the contact-level dielectric layer, wherein the at least one assist-field metallic plate has an areal overlap with at least one of the first gap region and the second gap region in the plan view.

15. The method of claim 14, comprising forming a gate spacer around the gate stack structure, wherein the gate spacer has an areal overlap with the entirety of the first gap region and the second gap region in the plan view.

16. The method of claim 14, further comprising:
forming a source contact via structure through the contact-level dielectric layer, wherein the source contact via structure is electrically connected to the source region and has a planar top surface within a horizontal plane including the top surface of the contact-level dielectric layer;
forming a drain contact via structure through the contact-level dielectric layer, wherein the drain contact via structure is electrically connected to the drain region and has a planar top surface within the horizontal plane including the top surface of the contact-level dielectric layer; and
forming a gate contact via structure through the contact-level dielectric layer, wherein the gate contact via structure is electrically connected to the gate electrode and has a planar top surface within the horizontal plane including the top surface of the contact-level dielectric layer.

17. The method of claim 16, further comprising:
forming a source-side metallic plate directly on the planar top surface of the source contact via structure;
forming a drain-side metallic plate directly on the planar top surface of the drain contact via structure; and
forming a gate-side metallic plate directly on the planar top surface of the gate contact via structure,
wherein the at least one assist-field metallic plate is different from the source-side metallic plate, the drain-side metallic plate, and the gate-side metallic plate.

18. The method of claim 17, wherein the at least one assist-field metallic plate comprises:
a first assist-field metallic plate located between the source-side metallic plate and the gate-side metallic plate; and
a second assist-field metallic plate located between the drain-side metallic plate and the gate-side metallic plate.

19. The method of claim 16, further comprising:
forming a source-side metallic plate directly on the planar top surface of the source contact via structure;
forming a drain-side metallic plate directly on the planar top surface of the drain contact via structure; and
forming a gate-side metallic plate directly on the planar top surface of the gate contact via structure, wherein the at least one assist-field metallic plate comprises a portion of at least one of the source-side metallic plate, the drain-side metallic plate, and the gate-side metallic plate.

20. The method of claim 19, wherein the at least one assist-field metallic plate comprises the portion of the gate-side metallic plate that overlies the first gap region and the second gap region.

* * * * *